United States Patent
Bhavnagarwala

(10) Patent No.: US 12,046,278 B2
(45) Date of Patent: Jul. 23, 2024

(54) FAST, ENERGY EFFICIENT CMOS 2P1R1W REGISTER FILE ARRAY USING HARVESTED DATA

(71) Applicant: Metis Microsystems, LLC, Newtown, CT (US)

(72) Inventor: Azeez Bhavnagarwala, Newtown, CT (US)

(73) Assignee: Metis Microsystems, LLC, Newtown, CT (US)

(*) Notice: Subject to any disclaimer, the term of this patent is extended or adjusted under 35 U.S.C. 154(b) by 42 days.

(21) Appl. No.: 17/578,482

(22) Filed: Jan. 19, 2022

(65) Prior Publication Data
US 2023/0120936 A1  Apr. 20, 2023

Related U.S. Application Data

(60) Provisional application No. 63/247,136, filed on Sep. 22, 2021, provisional application No. 63/138,456, filed on Jan. 17, 2021.

(51) Int. Cl.
*G11C 11/00* (2006.01)
*G11C 11/419* (2006.01)

(52) U.S. Cl.
CPC .................. *G11C 11/419* (2013.01)

(58) Field of Classification Search
CPC ....... G11C 8/16; G11C 11/419; G11C 11/412; G11C 11/405; G11C 11/4094;
(Continued)

(56) References Cited

U.S. PATENT DOCUMENTS

| | | | |
|---|---|---|---|
| 9,424,889 B1 * | 8/2016 | Liaw | ...................... H10B 10/12 |
| 10,777,260 B1 | 9/2020 | Chiu et al. | |

(Continued)

OTHER PUBLICATIONS

Arindrajit, Ghosh, et al., "Compiler compatible 5.66 Mb/mm2 8T 1R1W register file in 14 nm FinFET technology", Integration, the VLSI Journal (2020); 70: 126-137.
(Continued)

*Primary Examiner* — Thong Q Le

(57) ABSTRACT

New CMOS harvesting circuits are proposed that improve 2-port/multiport Register File Array circuit speed and substantially lower the energy cost of moving data along local and global bitpaths when engaging harvested data to self-limit energy dissipation. The uncertainty in BL signal development due to statistical variations in cell read current is eliminated by self-disabling action in the selected cell when the electric potential of harvested data matches the BL voltage from signal development while demanding fewer peripheral circuit transistors per column than conventional sensing schemes. Proposed bit path circuits engage harvested charge to provide immunity to disturb current noise during concurrent Read and Write access along a WL-eliminating the performance, area and energy overheads of BL keeper circuits typically required in conventional Register File arrays. Proposed circuits improve the reliability of Read performance-limiting bitcell devices from voltage accelerated aging mechanisms by lowering of vertical and lateral electric fields across these cell transistors when holding harvested charge during most of active and standby periods. Register File bitcell transistor design trade-off constraints between array leakage in active mode and read current are considerably relaxed when engaging harvested charge enabling much higher read currents for any given total array leakage. Area overheads of proposed circuits are expected to be marginally lower based on device widths of
(Continued)

Figure 1:
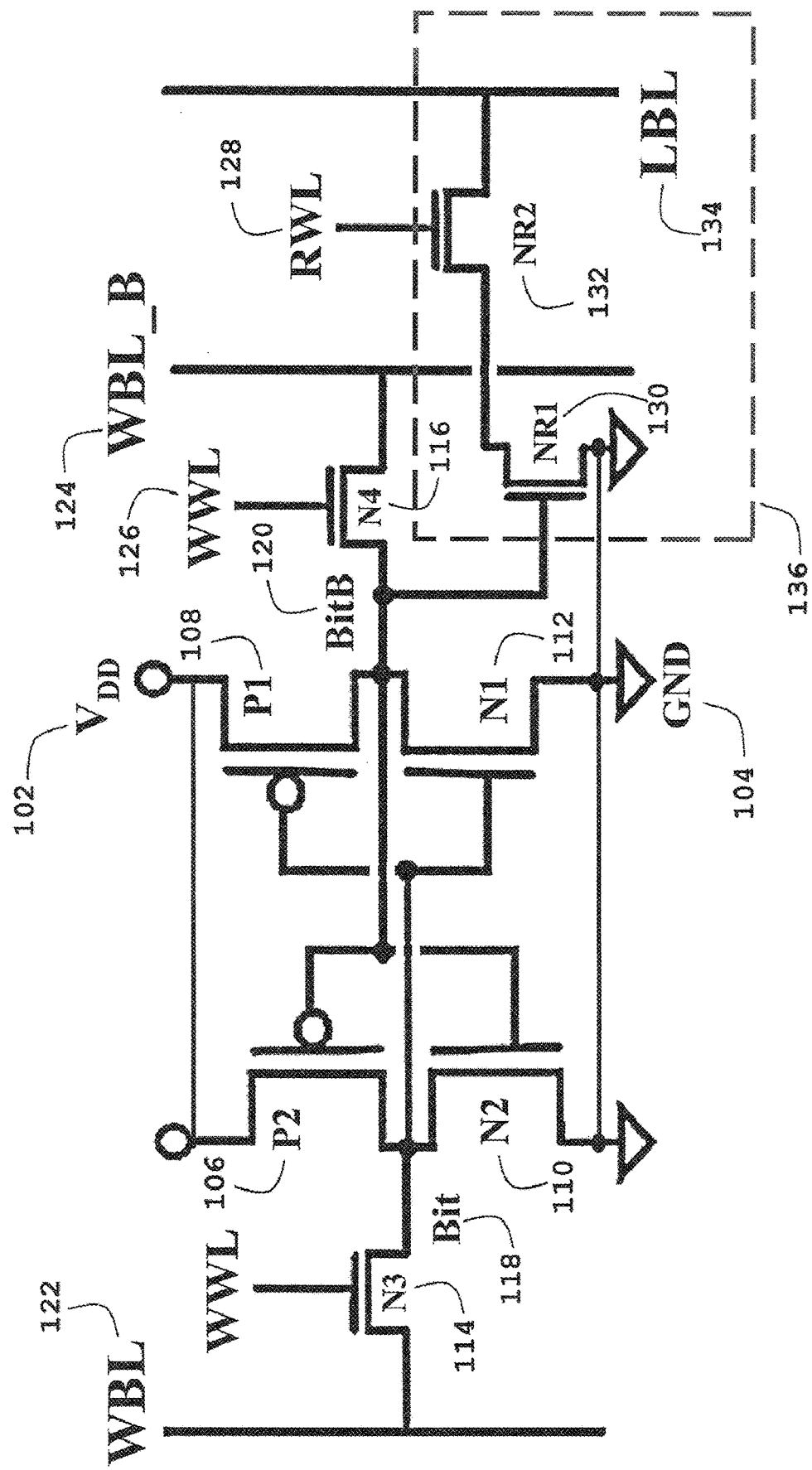

replacements to conventional peripheral circuits and can be further minimized by sharing of devices and their connections between bit slices of the array peripheral circuits. Moreover, proposed circuits do not require any changes to the CMOS platform, to the bitcell or to the array architecture with much of the flow for design, verification and test of 2-Port/multiport RF Memory arrays expected to remain unchanged—minimizing risk and allowing integration of proposed circuits into existing products with minimal disruption to schedule and cost.

20 Claims, 16 Drawing Sheets

(58) Field of Classification Search
CPC ........ G11C 11/4097; G11C 2211/4016; G11C 5/063; G11C 7/12; G11C 7/18; G11C 11/417; G11C 15/00; G11C 11/1675; G11C 11/1677; G11C 11/1693; G11C 11/418; G11C 11/56; G11C 15/04; G11C 2029/0409; G11C 11/1655; G11C 11/1657; G11C 11/406; G11C 11/411; G11C 11/413; G11C 15/046; G11C 29/44; G11C 29/4401; G11C 29/76; G11C 7/1009; G11C 11/1653; G11C 11/1697; G11C 11/34; G11C 11/40603; G11C 11/40615; G11C 2029/0411; G11C 2207/107; G11C 2207/2245; G11C 29/021; G11C 29/028; G11C 29/52; G11C 29/84; G11C 5/144; G11C 5/148; G11C 7/1006; G11C 7/1039; G11C 7/106; G11C 7/1066; G11C 8/08; G11C 8/12
USPC ... 365/154, 207, 230.05, 49.1, 49.17, 63, 72
See application file for complete search history.

(56) References Cited

U.S. PATENT DOCUMENTS

| | | |
|---|---|---|
| 2016/0118108 A1 | 4/2016 | Yamamoto |
| 2019/0096475 A1* | 3/2019 | Li .................... G11C 7/1006 |
| 2023/0042652 A1 | 2/2023 | Bhavnagarwala |
| 2023/0267994 A1 | 8/2023 | Bhavnagarwala |

OTHER PUBLICATIONS

[Author Unknown], "NVIDIA Ampere GA100 GPU: 8192 CUDA Cores and 54-Billion Transistors", Geeks3D (May 14, 2020); [Online] Retrieved from the Internet, https://www.geeks3d.com/20200514/nvidia-ampere-ga100-gpu-8192-cuda-cores-and-54-billion-transistors/#:~:text=Core%20GPU%20specifications%3A-,GA100%20GPU%20built%20on%20a%207nm%20manufacturing%20process,64%20CUDA%20per%20SM; 8 pages.
Bhavnagarwala, Azeez J., et al., "A minimum total power methodology for projecting limits on CMOS GSI", IEEE Transactions on Very Large Scale Integration (VLSI) Systems (Jun. 2000); 8(3): 235-251.
Bhavnagarwala, Azeez J., et al., "The impact of intrinsic device fluctuations on CMOS SRAM cell stability", IEEE Journal of Solid-State Circuits (Apr. 2001); 36(4): 658-665.
Burr, James B., et al., "A 200 mV self-testing encoder/decoder using Stanford ultra-low-power CMOS", 1994 IEEE International Solid-State Circuits Conference-ISSCC'94 (Feb. 16, 1994); pp. 84-85.
Dennard, Robert H., et al., "Design of ion-implanted MOSFET's with very small physical dimensions", IEEE Journal of Solid-State Circuits (Oct. 1974); SC-9(5): 256-268.
Fritsch, Alexander, et al., "A 6.2 GHz Single Ended Current Sense Amplifier (CSA) Based Compileable 8T SRAM in 7nm FinFET Technology", 2021 IEEE International Solid-State Circuits Conference (ISSCC) Digest of Technical Papers (Feb. 18, 2021); 64: 334-336.
Fujiwara, Hidehiro, et al., "A 64kb 16nm asynchronous disturb current free 2-port SRAM with PMOS pass-gates for FinFET technologies", 2015 IEEE International Solid-State Circuits Conference (ISSCC) Digest of Technical Papers (Feb. 25, 2015); pp. 312-313.
Gao, Mingyu, et al., "TETRIS: Scalable and Efficient Neural Network Acceleration with 3D Memory", Proceedings of the Twenty-Second International Conference on Architectural Support for Programming Languages and Operating Systems (ASPLOS '17) (Apr. 8-12, 2017); pp. 751-764.
Gebhart, Mark, et al., "A Hierarchical Thread Scheduler and Register File for Energy-Efficient Throughput Processors", ACM Transactions on Computer Systems (TOCS) (Apr. 2012); 30(2): 1-38.
Gebhart, Mark, et al., "Energy-efficient mechanisms for managing thread context in throughput processors", 2011 38th Annual International Symposium on Computer Architecture (ISCA'11) IEEE (Jun. 4-8, 2011); pp. 235-246.
Gebhart, Mark, et al., "Unifying Primary Cache, Scratch, and Register File Memories in a Throughput Processor", 2012 45th Annual IEEE/ACM International Symposium on Microarchitecture IEEE (Jun. 2012); pp. 96-106.
Hennessy, John L., et al., "A new golden age for computer architecture", Communications of the ACM (Feb. 2019); 62(2): 48-60.
Ho, Chih-Hsiang, et al., "Analysis of Stability Degradation of SRAMs Using a Physics-Based PBTI Model", IEEE Electron Device Letters (Sep. 2014); 35(9): 951-953.
Horowitz, Mark. "Computing's energy problem (and what we can do about it)", 2014 IEEE International Solid-State Circuits Conference Digest of Technical Papers (ISSCC) IEEE (Feb. 10, 2014); pp. 10-14.
Keane, John, et al., "5.6Mb/mm2 1R1W 8T SRAM arrays operating down to 560mV utilizing small-signal sensing with charge-shared bitline and asymmetric sense amplifier in 14nm FinFET CMOS technology", 2016 IEEE International Solid-State Circuits Conference (ISSCC) IEEE (Feb. 3, 2016); pp. 308-310.
Keyes, Robert W., "The effect of randomness in the distribution of impurity atoms on FET thresholds", Applied Physics (1975); 8(3): 251-259.
Kulkarni, Jaydeep P., et al., "Low Swing and col. Multiplexed Bitline Techniques for Low-Vmin, Noise-Tolerant, High-Density, 1R1W 8T-Bitcell SRAM in 10nm FinFET CMOS", 2020 IEEE Symposium on VLSI Circuits. IEEE (Jun. 2020); 2 pages.
Meindl, J. D., et al., "The impact of stochastic dopant and interconnect distributions on gigascale integration", 1997 IEEE International Solids-State Circuits Conference (ISSCC) Digest of Technical Papers (Feb. 7, 1997); pp. 232-233 and 463.
Meyerson, Bernard, "Collaborative innovation; a new lever in information technology development", IBM (2005); 27 pages.
Nintunze, Novat, et al., "A Register File with 8.4GHz Throughput for Efficient Instruction Scheduling in a Pentium~ 4 Processor", 2006 Symposium on VLSI Circuits Digest of Technical Papers IEEE (2006); 2 pages.
Ohr, Stephan, "Intel technologist cites power as biggest issue", EE Times50 (Feb. 5, 2001); [Online] Retrieved from the Internet, https://www.eetimes.com/intel-technologist-cites-power-as-biggest-issue/#; 3 pages.
Pelgrom, Marcel J.M., et al., "Matching properties of MOS transistors", IEEE Journal of Solid-State Circuits (Oct. 1989); 24(5): 1433-1440.
Singh, Rahul, et al. "Bitline techniques with dual dynamic nodes for low-power register files", IEEE Transactions on Circuits and Systems I: Regular Papers (2013); 60(4): 965-974.
Sze, Vivienne, et al., "Efficient Processing of Deep Neural Networks: A Tutorial and Survey", Proceedings of the IEEE (Dec. 2017); 105(12): 2295-2329.

(56) References Cited

OTHER PUBLICATIONS

Yabuuchi, Makoto, et al., "A 28nm high density 1R/1W 8T-SRAM macro with screening circuitry against read disturb failure", Proceedings of the IEEE 2013 Custom Integrated Circuits Conference IEEE (2013); 4 pages.
Yi, Maoxiang, et al., "Co-mitigating circuit PBTI and HCI aging considering NMOS transistor stacking effect", 2016 International Symposium on Integrated Circuits (ISIC) IEEE (2016); 5 pages.
Zhang, Kevin, et al., "The scaling of data sensing schemes for high speed cache design in sub-0.18 /spl mu/m technologies", 2000 Symposium on VLSI Circuits Digest of Technical Papers (2000); pp. 226-227.
Extended European Search Report for European Application No. EP23167618 dated Oct. 24, 2023, 10 pages.
Non-Final Office Action for U.S. Appl. No. 17/951,049 dated Aug. 29, 2023, 9 pages.

\* cited by examiner

100

200

400

500

600

700

800

900

1000

1100

1200

1300

1400

1500

1600

FAST, ENERGY EFFICIENT CMOS 2P1R1W REGISTER FILE ARRAY USING HARVESTED DATA

1. BACKGROUND OF THE INVENTION

A. Introduction

While chip power density of CMOS chips was held constant with constant electric field (Dennard) scaling for over 30 years [1], increases in CMOS device electrical variability at lower operating voltages and scaled geometries [2-4] in tandem with reductions in circuit speed from non-scaling of gate overdrive due to exponential increases in leakage from scaling MOSFET threshold voltages [5-6] have limited CMOS voltages from scaling to much below 1V. These limitations brought an end to constant field scaling in 2004 [7]. With constant voltage scaling, chip power density increases [8] as the cube of scaling factor with heat removal inefficiencies limiting processor clock frequencies to below 5 GHz [9] making processor performance increasingly constrained by its energy efficiency.

The energy consumption for various arithmetic operations and memory accesses in [10] shows the relative energy cost dominated by energy consumed from moving data in a memory access that is higher than energy consumed for arithmetic operations. Large last-level caches are included on the CPU chip to scale memory stall time with performance by lowering the miss rate of the processor's caches. However, since most of the memory bitcells are idle most of the time, the energy dissipation of large on-chip CPU cache memory is dominated by its leakage with caches and register files (RF) consuming over 50% of the CPU's energy [10].

GPUs are widely preferred over CPUs to accelerate AI workloads because Deep Neural Network (DNN) model training is composed of simple matrix math and convolution calculations, the speed of which can be greatly enhanced if the computations can be carried out in parallel. GPUs use tens of thousands of threads to pursue high throughput performance with extreme multithreading [11]. Extreme multithreading requires a complex thread scheduler as well as a large register file, which is expensive to access both in terms of energy and latency [12]. In GPUs, the bottleneck for DNN processing is in the memory access—with each multiply and accumulate (MAC) operation requiring three memory read accesses and one memory write access [13]. In energy efficient Dataflows that maximize data reuse and local accumulation of data, the energy consumed by Register File arrays contributes to nearly 70% of the energy of a MAC operation [13].

Each thread in a GPU must store its register context on-chip. Unlike CPUs that hide latency of a single thread by using a large last-level on-chip cache, GPUs use a large number of threads and switch between them to hide memory access latency [14]. Just holding the register context of these threads requires substantial on-chip storage. With tens of thousands of threads, register file arrays are one of the largest on-chip memory resource in current GPUs [15] making the Register File & SRAM buffers the limiting factor on GPU performance, active power and leakage [16].

B. Prior Art: Conventional 2-Port 1R1W Register File Array Circuits (i) 2-Port Register File (2P RF) bitcells shown in FIG. 1 100 (schematic) and FIG. 2 200 (layout) provide faster signal development rates on the LBL, 134, 234 and demonstrate lower VMIN when compared to conventional 6T SRAM bitcells. Primarily used when both Read and Write access to memory are desired in the same cycle for higher memory access throughput performance, 2P RF cells use fast NFET transistors—NR1 130, 230 and NR2 132,232 in the read stack—shown in the dashed box 136, 236 to accomplish higher read current at the decoupled read port of the bitcell connected to the local bitline, LBL 134, 234. The decoupling of the read stack 136, 236 allows a higher read performance without being required to trade it off for higher read stability margins as is required in the 6T SRAM cell. The decoupled read stack also allows the Write margin at low voltages to be independently optimized for lower VMIN. The decoupled NFET Read stack (NR1 130, 230 NR2 132,232) in FIGS. 1 100, 2 200 driving the read port in the 2P RF bitcell—typically optimized for performance, is also typically leakier than other bitcell devices.

The conventional 2P RF bitpath assumed (FIG. 3 300) serves as a baseline reference relative to which improvements are typically reported by industry and academia alike [17-20]. All of these recent (within last 4 years) references assume this 'Domino Read' full-swing bitline approach as the baseline reference to compare their Register File array implementations with.

(ii) Full-Swing, Short-BL sensing with Logic Gates: Small signal differential sensing—typically used in 6T arrays due to small area overheads and robust operation, is not as attractive for RF arrays because differential sense amps do not track delay scaling in logic circuits and because the small signal development rate on the bitline depends on bitline loading capacitance—dominated by local interconnects in each bitcell which don't scale with device geometries [21]. The scaling of transistor dimensions also degrades random mismatch at the sense amplifier input [22] that translates into larger sense amplifier voltage offsets the BL signal must overcome as a performance overhead.

Figure 3:
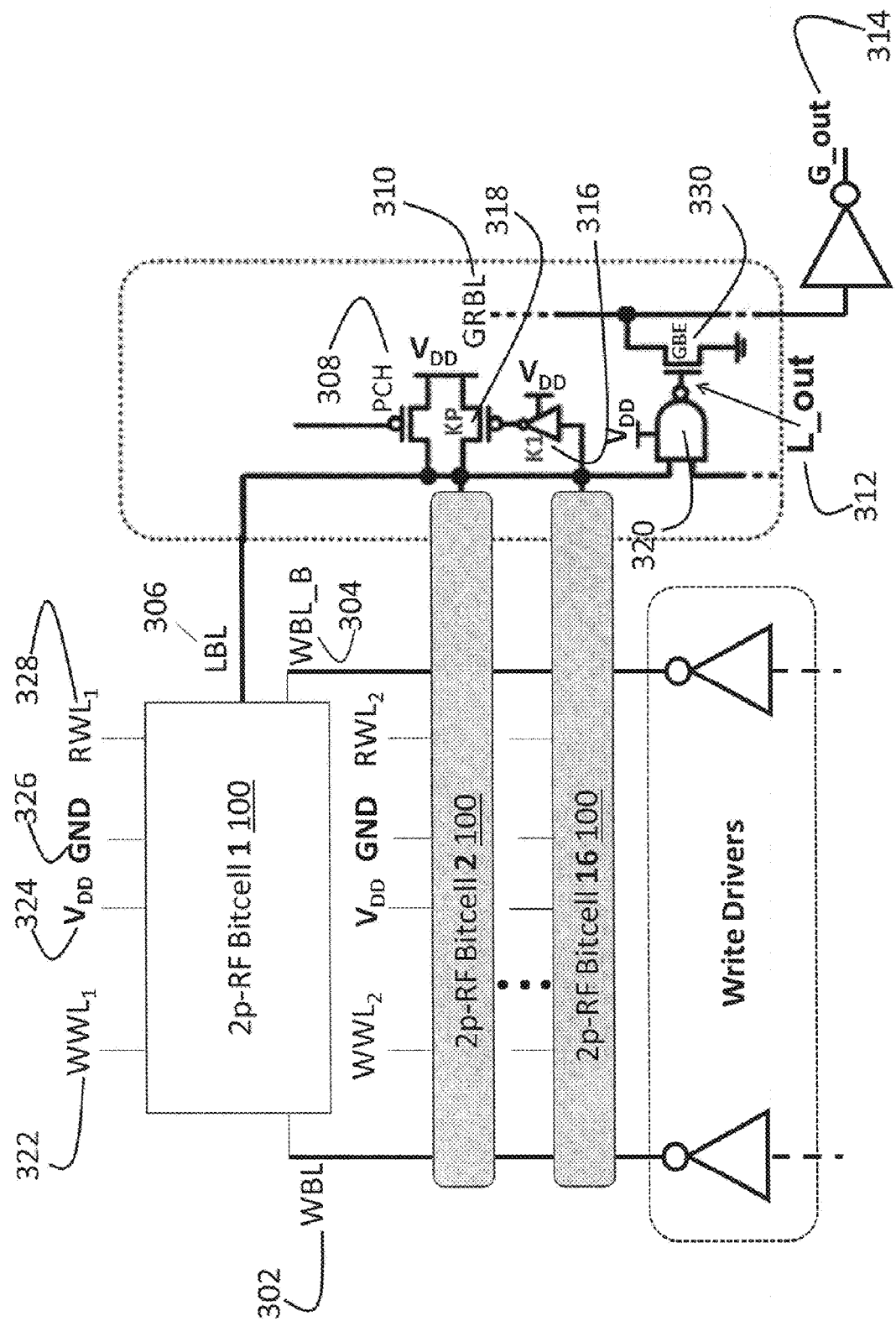

Alternative large signal sensing schemes for RF arrays, shown in FIG. 3 use a NAND gate [21] and short bit lines ($^{16}\!/_{32}$ bits/BL). In the 'Domino Read' scheme, static CMOS circuits for sensing, short bitlines and rail-rail swings on bitlines eliminate the performance scaling issues seen with differential sensing while the global bitline at an upper metal level routes sensed data across the height of the array at low resistance. This scheme is widely adopted across industry for 2P RF arrays enabling them to deliver much higher performance in GPUs that scales with logic gate technology at a high cost in (GPU) chip size and in switching and leakage power.

(iii) Dynamic Read Access: Dynamic circuits that precharge output nodes so they evaluate much faster on arrival of the clock edge with inputs stable during evaluation—are found in practically all fast memory arrays. Precharge of local and global bitlines and their evaluation by bitcells at the arrival edge of the Read WL select transition are an example in 2P RF bitcell arrays. However, these techniques are energy inefficient since all of the charge discarded (from the LBL and the GRBL in FIG. 4) to the reference ground potential during evaluate must be resupplied during the BL precharge phase before the next Read cycle. In a typical 2P RF Array Instance [23], as many as 256 local BL columns are accessed by a Read WL in an 8 KB instance. However, only a few rows in the WL direction are selected during the same cycle (Read WL, Write WL, Precharge and a few other control signals in the WL direction) making the bit path in a 2P RF array from bitcell to output latch, the dominant (>95%) energy consumption component in a 2P RF array.

(iv) Disturb Current Read Failure avoidance with BL Keeper: The read stack 136, 236 in FIG. 1 100, 2 200 also increases the risk of read failure from disturb current [24] if data at cell node 'BitB' 120, 220 in FIG. 1 100 & FIG. 2 200 is a '0' during a concurrent read and write access along the same WL. Because the Write WL half selects the bitcell (write BL pair [WBL, WBL_B] are both precharged to $V_{DD}$), the cell node 'BitB' at '0' typically rises 100-150 mV due to the voltage divider across N1 and N4, partially turning on NFET NR1 130,230 in the read stack 136, 236. At relevant fast N, high T corners (where additional noise by way of VT reductions due to temperature, process and random variations) the local bitline (LBL) 134,234 begins evaluating (with a lower read current) as the gate input of NR1 rises to an effective noise voltage assumed as 300 mV in circuit simulations below. This noise level is sufficient for the bitpath to read out the wrong data at slower cycle times, given a sufficiently wide distribution of Read current in the RF bitcell [24]. Examples of the industry-wide adopted solution [23-26] for this read failure mechanism is to add keeper circuitry K1, KP (316, 318) in FIG. 3 300 where KP is driven by feedback inverter K1 from the local bitline shown in FIG. 3 300. The impact on signal development time on the LBL at the low T, slow NP corners where the selected bitcell must fight the keeper KP (already in the saturation region) harder to develop signal can be as high as a 20+% signal development time degradation [23].

(v) An Industry Solution to Disturb Current read failure: One alternative solution to the keeper approach described above for disturb current read failure has been to use PFETs instead of NFETs for access devices N3, N4 in the 2P RF bitcell driven by the Write WL [23] using precharged-low Write BLs in half-selected bitcells during simultaneous read and write access of the 2P RF bitcell. This solution eliminates the voltage bump at the gate of the Read stack device NR1 in the when 'BitB' is 0, but the on-current of NR1 is degraded by up to 35%[23] due to a drop in the high node storage level at 'BitB' when both RWL and WWL in the same row are simultaneously turned on—effectively degrading read current. In [23] the RWL voltage is bootstrapped by 15-20% to recover performance when using Write PFET access transistors to eliminate Disturb Current driven Read failure. The power & area overheads in doing so appear significant given the size of bootstrap capacitors required to deliver sufficient charge to the WL. Also, this solution assumes approximately equal drive strengths of NFETs and PFETs due to the introduction of embedded Si/Ge source/drain that enhances hole mobility. Absent this feature in older CMOS platforms, other complications of lowering write margins (and raising write VMIN) could arise when using weaker PFET instead of NFETs as access devices driven by the write WL.

(vi) High Leakage through Fast Read Stack: Another negative consequence of the use of the Keeper PFET solution is that when the local bitline LBL 306 is held at VOD by the keeper KP, 318 during active or standby mode, all bitcells connected to the local bitline, are draining high leakage current from the bitline (due to a drop of a full $V_{DD}$ across the NFETs in the read stack) through an already leaky stack—some of which are worse (whose bitcells have 'BitB'=1 turning on the lower of the two devices in the Read stack). These leakage paths are 'live' for all local bitlines across the aggregate RF array in a GPU during active mode and for all bitlines except those discharged in the last access before entering inactive mode.

(vii) Reliability of NR1 in read stack: NMOS transistor aging mostly arises from positive bias temperature instability (PBTI), hot carrier injection (HCI) and time-dependent dielectric breakdown (TDDB). In an NFET stack 136, 236 in FIG. 1 100, 2 200, a '1' at 'BitB' that drives the gate input of transistor NR1 130, 230 in the Read stack of the 2P RF bitcell, could assert PBTI stress on NR1 with $V_{DD}$ asserted between the Gate-to-Source and Gate-to-Drain terminals over extended periods [27]. A full $V_{DD}$ also drops along the channel of NR2 during inactive modes leading to high sustained lateral fields when the local bitline is held at $V_{DD}$ with keeper circuitry. The VT shift of NR1 due to PBTI in 6T SRAM bitcells where the pull-down inverter NFET experiences a similar voltage stress is reported in [28] for stress times up to 100M secs (3 years) of 10-15 mV. This PBTI shift in NR1 due to high vertical fields can add to HCI driven shifts in NR2 due to high lateral fields to degrade read stack current/performance and variability in a 2P RF cell.

(viii) Multi-port Register File arrays: Note that while this invention details the circuit schemes proposed for a 2P RF register file bitcell array, these are easily extended to Register File arrays with additional i Read Ports by adding NFET transistor pairs (corresponding to the Read stack 536, 636 in FIG. 5 500, FIG. 6 600) for each additional Read port with the gate input of the lower NFET—$NR1_i$ driven by the cell storage node 'BitB' and the gate input of the upper NFET in the stack, $NR2_i$ driven by the Read Word Line for each Read port, $RWL_i$. The source terminal of NR11 is connected to a harvesting node $V2L_1$ for each Read port i.

Similarly, each additional Write port j is added to the schematic in FIG. 5 500, 6 600 of the 2P RF bitcell by including j pairs of NFET PG devices $N3_j$ and $N4_j$ that connect the cell storage nodes to j pairs of local Write bitlines—$WBL_j$, $WBL\_B_j$ with each of j pairs of NFET PG devices $N3_j$, $N4_j$ driven by the Write Word Line for each Write port, $WWL_j$ at their gate inputs. The peripheral circuits associated with the local and global bitline for each read/write port i/j are identical to those described in FIG. 7 700

2. BRIEF SUMMARY OF THE INVENTION

New CMOS harvesting circuits are proposed that improve 2-port/multiport Register File Array circuit speed and substantially lower the energy cost of moving data along local and global bitpaths when engaging harvested data to self-limit energy dissipation. The uncertainty in BL signal development due to statistical variations in cell read current is eliminated by self-disabling action in the selected cell when the electric potential of harvested data matches the BL voltage from signal development while demanding fewer peripheral circuit transistors per column than conventional sensing schemes. Proposed bit path circuits engage harvested charge to provide immunity to disturb current noise during concurrent Read and Write access along a wL-eliminating the performance, area and energy overheads of BL keeper circuits typically required in conventional Register File arrays. Proposed circuits improve the reliability of Read performance-limiting bitcell devices from voltage accelerated aging mechanisms by lowering of vertical and lateral electric fields across these cell transistors when holding harvested charge during most of active and standby periods. Register File bitcell transistor design trade-off constraints between array leakage in active mode and read current are considerably relaxed when engaging harvested charge enabling much higher read currents for any given total array leakage. Area overheads of proposed circuits are expected to be marginally lower based on device widths of replacements to conventional peripheral circuits and can be further minimized by sharing of devices and their connections between bit slices of the array peripheral circuits. Moreover, proposed circuits do not require any changes to the CMOS platform, to the bitcell or to the array architecture with much of the flow for design, verification and test of 2-Port/multiport RF Memory arrays expected to remain unchanged—minimizing risk and allowing integration of proposed circuits into existing products with minimal disruption to schedule and cost.

3. BRIEF DESCRIPTION OF DRAWINGS

FIG. 1 100 shows the schematic of a Conventional 2P RF bitcell. Cell transistor, circuit node and cell terminal names are identified.

Figure 2:
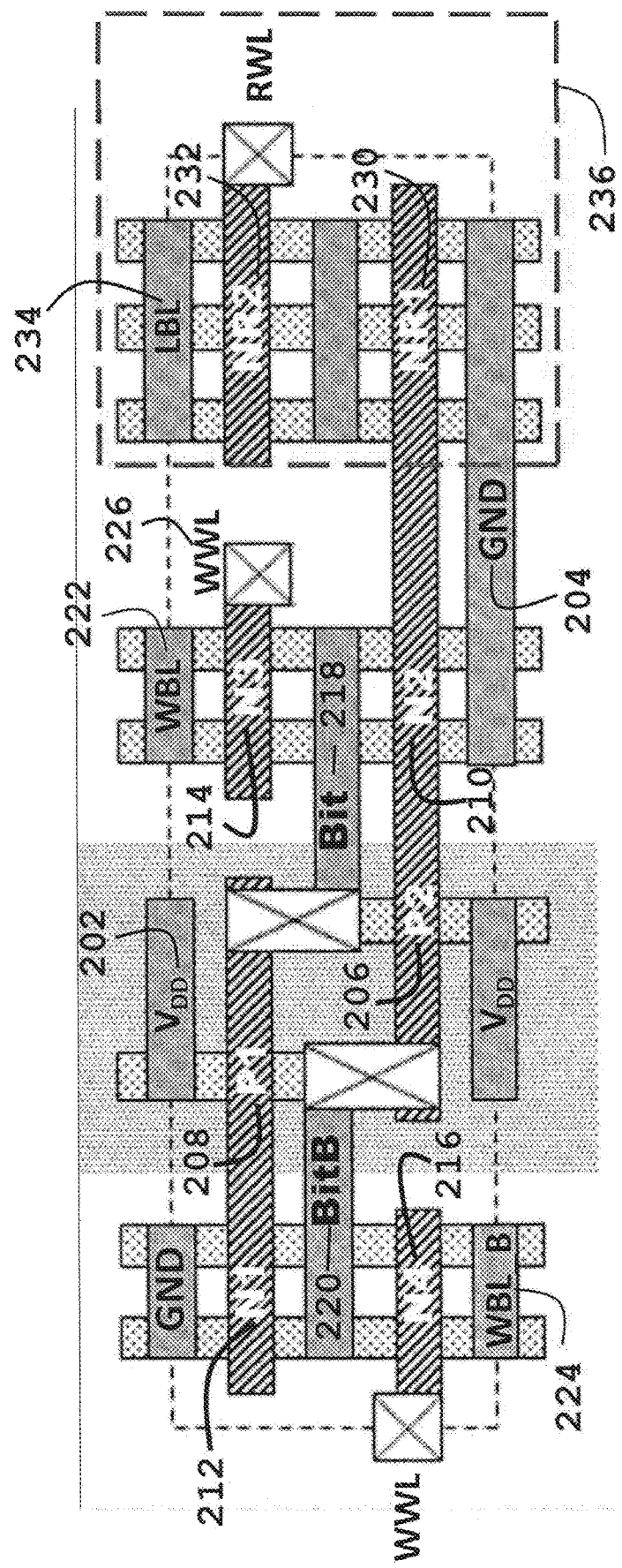

FIG. 2 200 shows the layout of an industry typical 8 transistor 2P RF bitcell [23]. FIG. 2 200 is frequently referred to in the Spec along with FIG. 1. Cell transistor, circuit node and cell terminal names are identical to those in the circuit schematic shown in FIG. 1. Typical of high performance 2P RF bitcells, this has fast NFETs in the Read Stack that are 3 fins wide.

Figure 4:
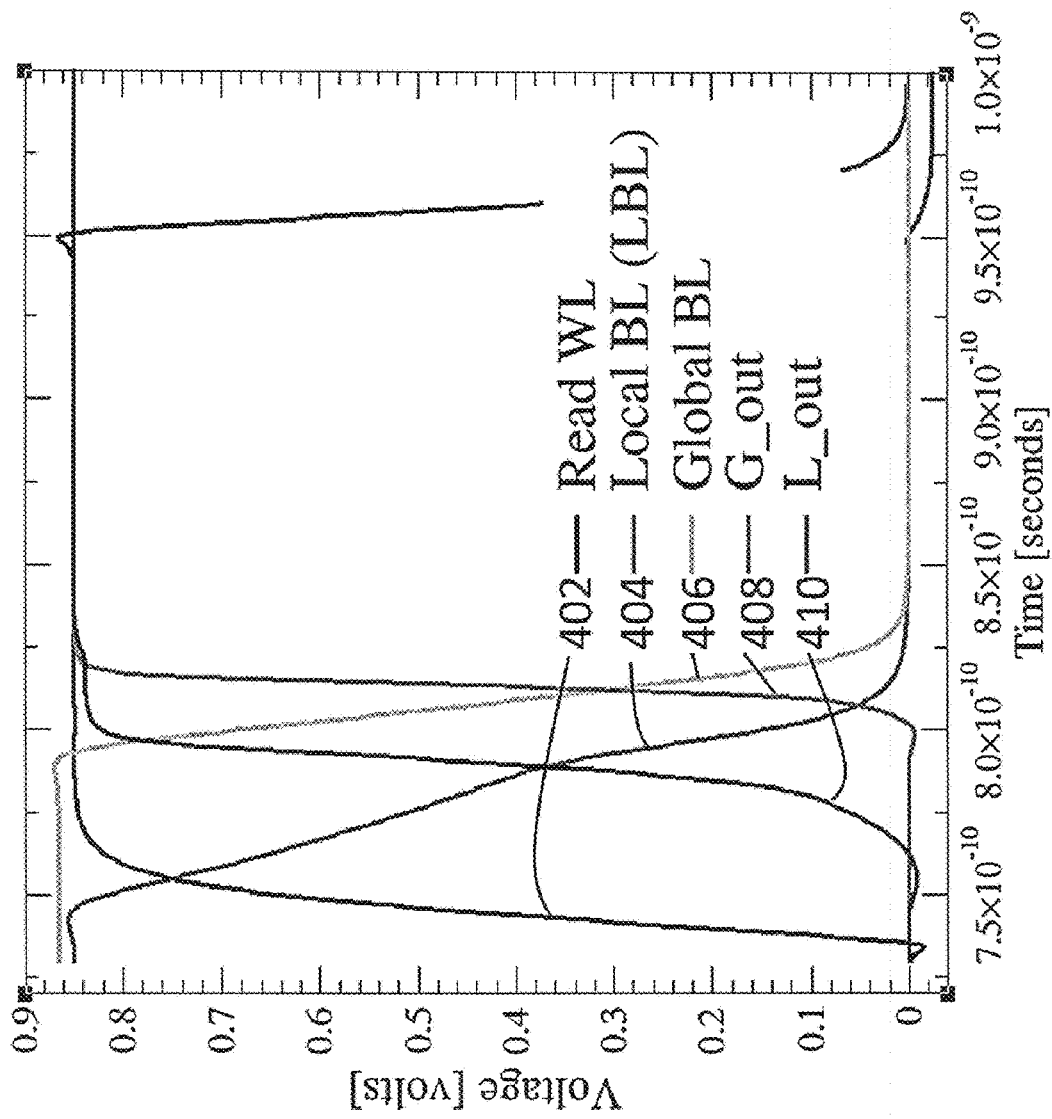
Figure 5:
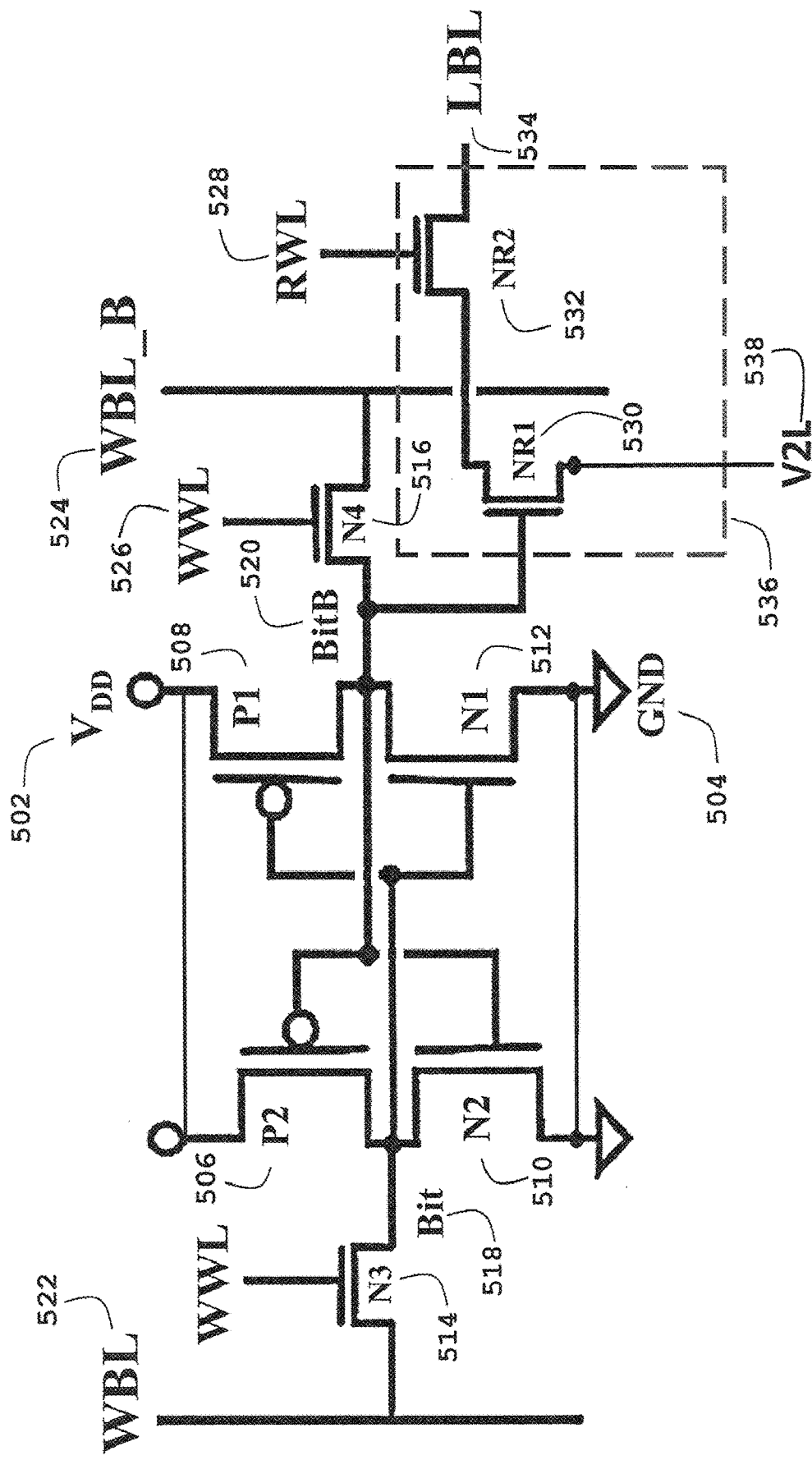

FIG. 3 300 shows the Circuit schematic of a conventional 2P Register File CMOS bit path. Typical of most 2P RF array bitpaths, it embodies keeper circuits to avoid read-disturb during concurrent Read and Write access to the same Word Line, uses a 'Domino Read' large signal sensing scheme, a local and global bitline hierarchy and a short bitline (16b) architecture FIG. 4 400 shows the waveforms of key circuit nodes along the bitpath of a conventional 2P RF array. Response of the local and global bitline to a Word Line select transition and also the signal outputs of the local and global bitpaths FIG. 5 500 shows how the circuit schematic of the conventional 2P RF bitcell is used to implement proposed harvesting scheme where the reference ground terminal of the Read Stack NFET pair in the conventional 2P RF bitcell serves as the harvesting node in proposed scheme.

Figure 6:
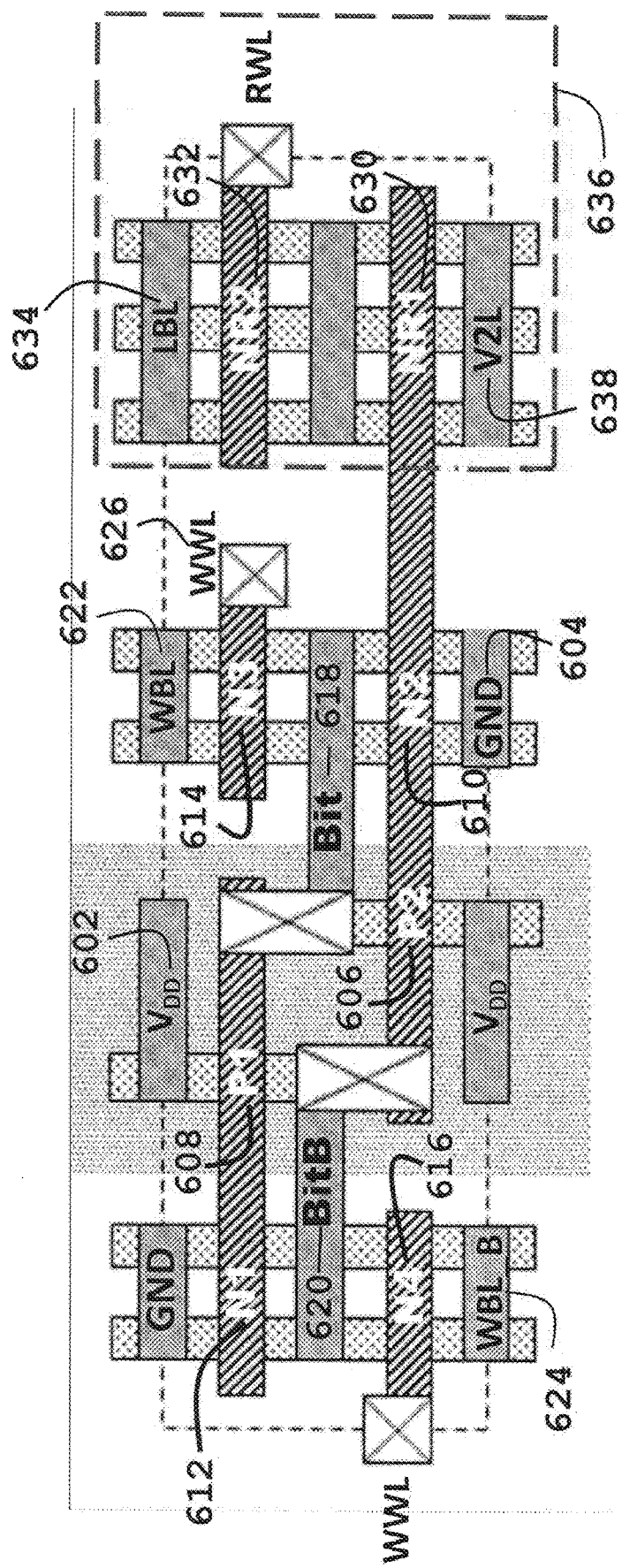

FIG. 6 600 shows the layout of an industry typical 8-transistor 2P RF bitcell [23] with the Ground terminal of the read stack electrically isolated as the harvesting node V2L from the ground terminals of the pull down NFETs of the 6T part of the 2P RF bitcell. As with FIGS. 1 and 2, FIGS. 5 & 6 are frequently referred together in the Spec with Cell transistor, circuit node and cell terminal names in FIG. 6 identical to those in the circuit schematic shown in FIG. 5.

Figure 7:
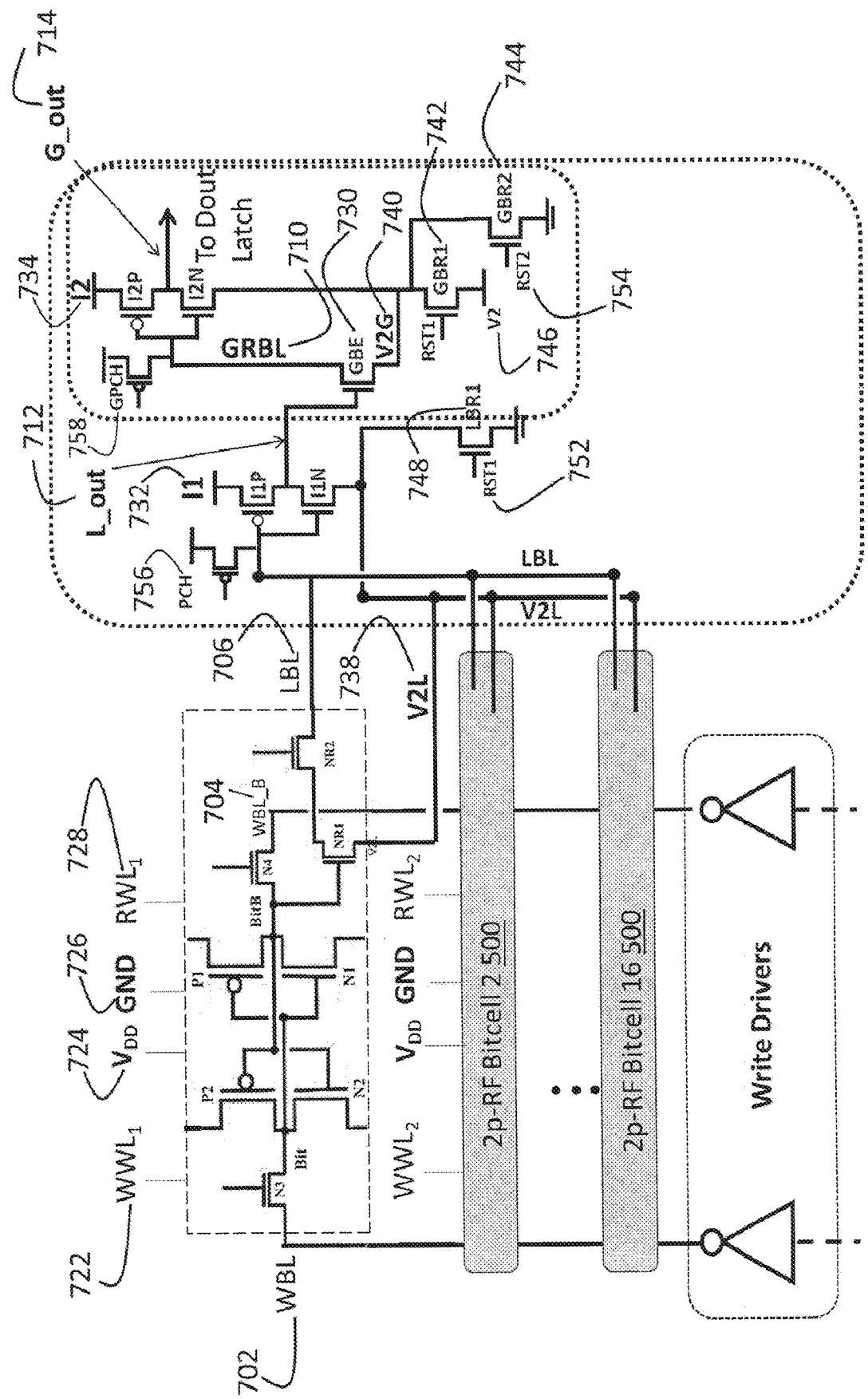

FIG. 7 700 shows the circuit schematic of an embodiment of the proposed 2P RF bitpath. Highlight of the proposed schematic is the harvest of evaluation charge and its use to double the sense speed, eliminate uncertainty of bit line signal development, substantially lower active power of a read access and do so with fewer peripheral circuit transistors than conventional large signal sensing or differential sensing schemes.

Figure 8:
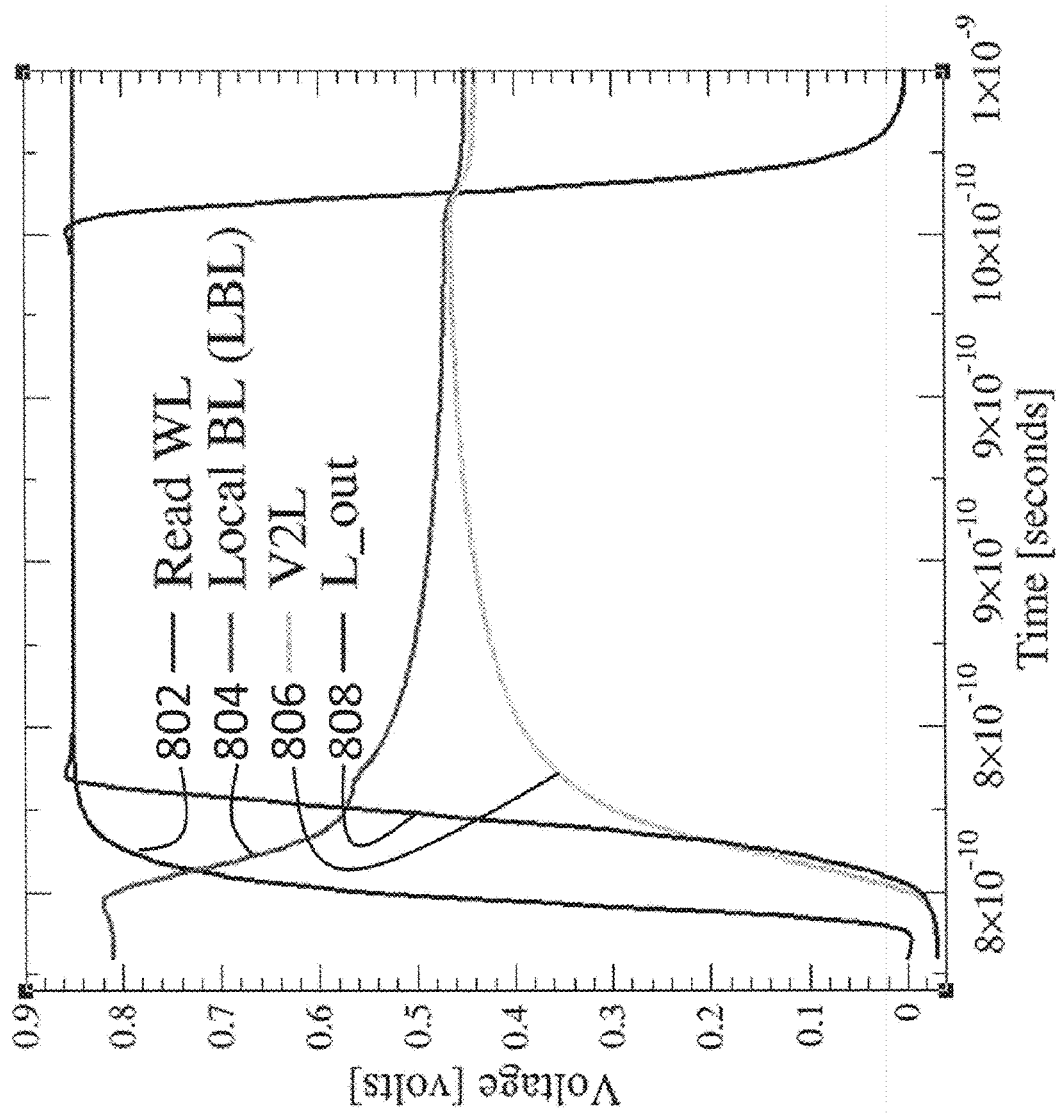
Figure 9:
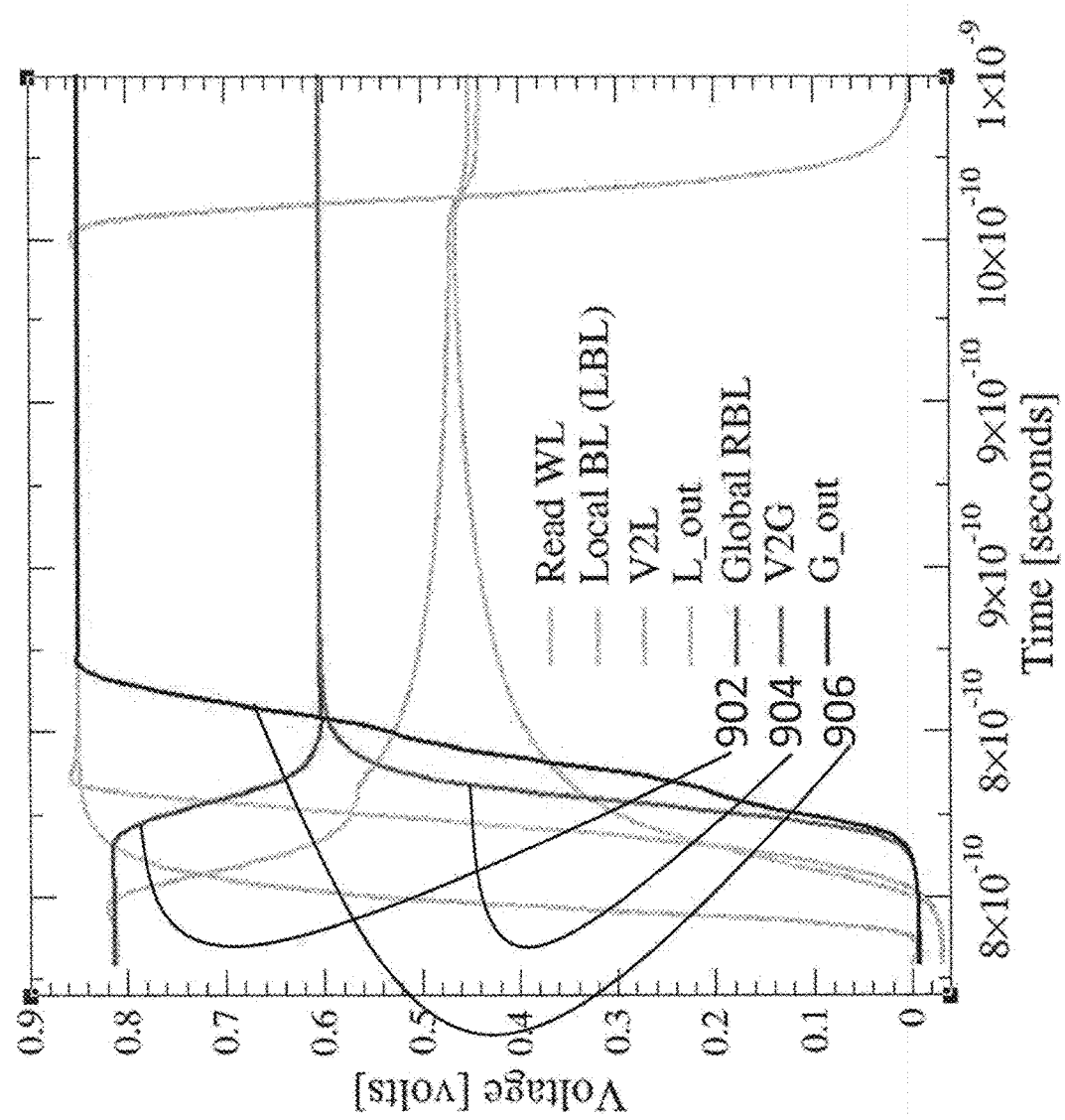

FIG. 8 800 shows the waveforms of key circuit nodes along the proposed local 2P RF bitpath. Response of the local bitline and the local harvesting column (node V2L) of the accessed bitcell shows that the data from the accessed cell is sensed without loss of any of the precharge on the local BL. None of the electric charge the local bitline is precharged with is drained to ground—it is all harvested. Secondly, the voltage signal developed on the local BL is no longer variant with the read current of the accessed bitcell—it is determined by the capacitive divider between the local bitline and the harvesting column node making this voltage signal developed on the local bitline deterministic and not uncertain as in conventional 2P RF bitpaths. Thirdly, the signal development on the local BL self-disables as the electric potential of harvested data on node V2L rises to equalize the dropping voltage of the local bitline turning off the read current even if the WL may still be selected. Secondly, the voltage signal developed on the local BL is no longer variant with the read current of the accessed bitcell—it is determined by the capacitive divider between the local bitline and the local harvesting column node making this voltage signal developed on the local bitline deterministic and not uncertain as in conventional 2P RF bitpaths. Thirdly, the signal development on the local BL self-disables as the electric potential of harvested data on node V2L rises to equalize the dropping voltage of the local bitline turning off the read current even if the WL is still selected FIG. 9 900 shows the waveforms of key circuit nodes along the proposed 2P RF global bitpath. Response of the Global Read Bitline and the global harvesting column (node V2G) of the accessed bitcell shows that the data from the accessed cell is also sensed without loss of any of the precharge on the Global Read BL. None of the electric charge the global bitline is precharged with is drained to ground—it is all harvested. Secondly, the voltage signal developed on the Global Read BL is also determined by the capacitive divider between the Global Read Bitline and the global harvesting column capacitance making this voltage signal developed on the global bitline also deterministic and not uncertain as in conventional 2P RF bitpaths. Thirdly, the capacitive divider can be implemented so that only a fraction of the charge on the global bit line is sufficient to resolve the data sensed. Fourthly, the signal development on the Global Read Bitline self-disables as the electric potential of harvested data on node V2G rises to equalize the dropping voltage of the Global Read Bitline turning off Global Read Bitline discharge even if the Global Bitline Evaluation NFET is evaluating.

Figure 10:
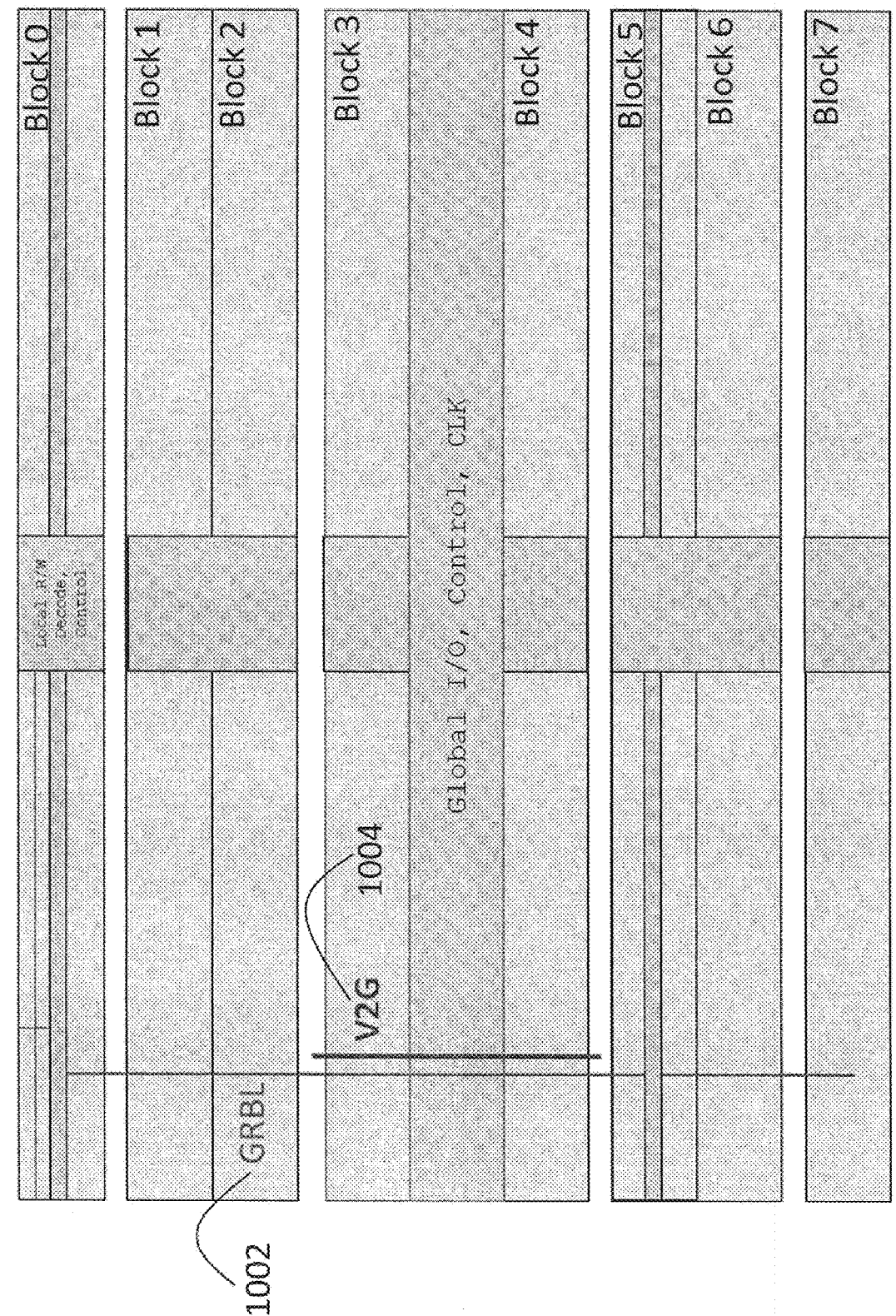

FIG. 10 1000 shows an example global bitpath where a Global bitpath can accomplish a capacitive divider of 35% ($C_{v2G}/C_{GRBL}$=0.35) by having the Global Bitline Evaluate (in FIG. 7, GBE 730) NFETs in the schematic shown in FIG. 7 placed between Blocks 2 and 3 and between Blocks 4 and 5 in FIG. 10. This capacitance divider leads to the V2G harvest node rising to 1/1.35 of ($V_{DD}$=0.8V) or 0.6V—as illustrated in the waveforms shown in FIG. 9 900

Figure 11:
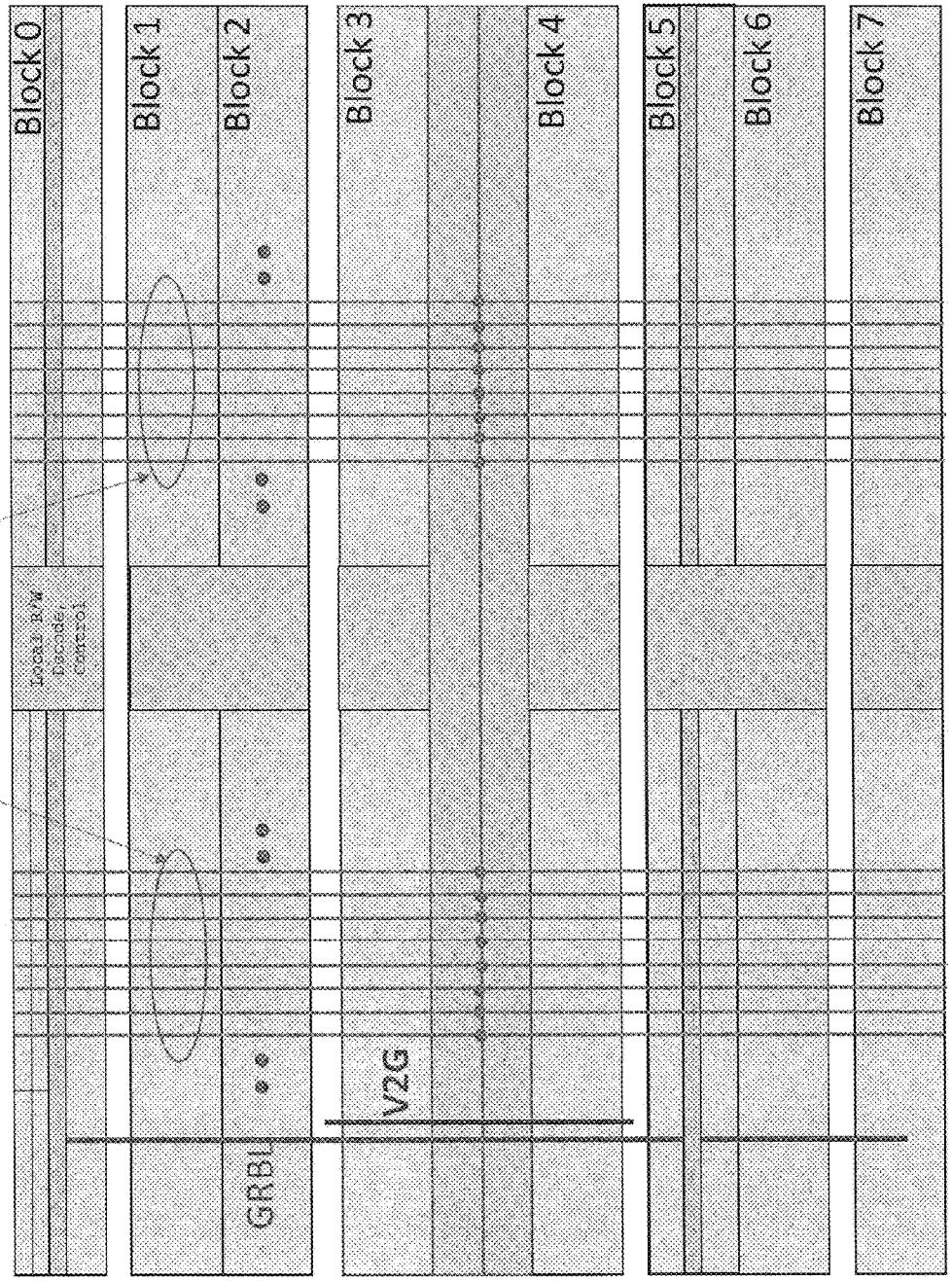

FIG. 11 1100 shows the V2 grid (746 in FIG. 7) in the 2P RF array corresponding to the node to which the charge harvested at V2G in each bit column is discharged to raising the electric potential of the V2 grid to a maximum of 0.6V assuming the capacitive divider of 35% between the Global Read Bitline GRBL and the global bitline harvesting node V2G. Charge harvested on the V2 grid at 0.6V can be used to partially power 0→1 logic transitions with circuits described in application Ser. No. 17/497,974. These circuit can drive the WL, Data along the global Write Bitline, high fanout decoders or repeaters along global signaling routes.

Figure 12:
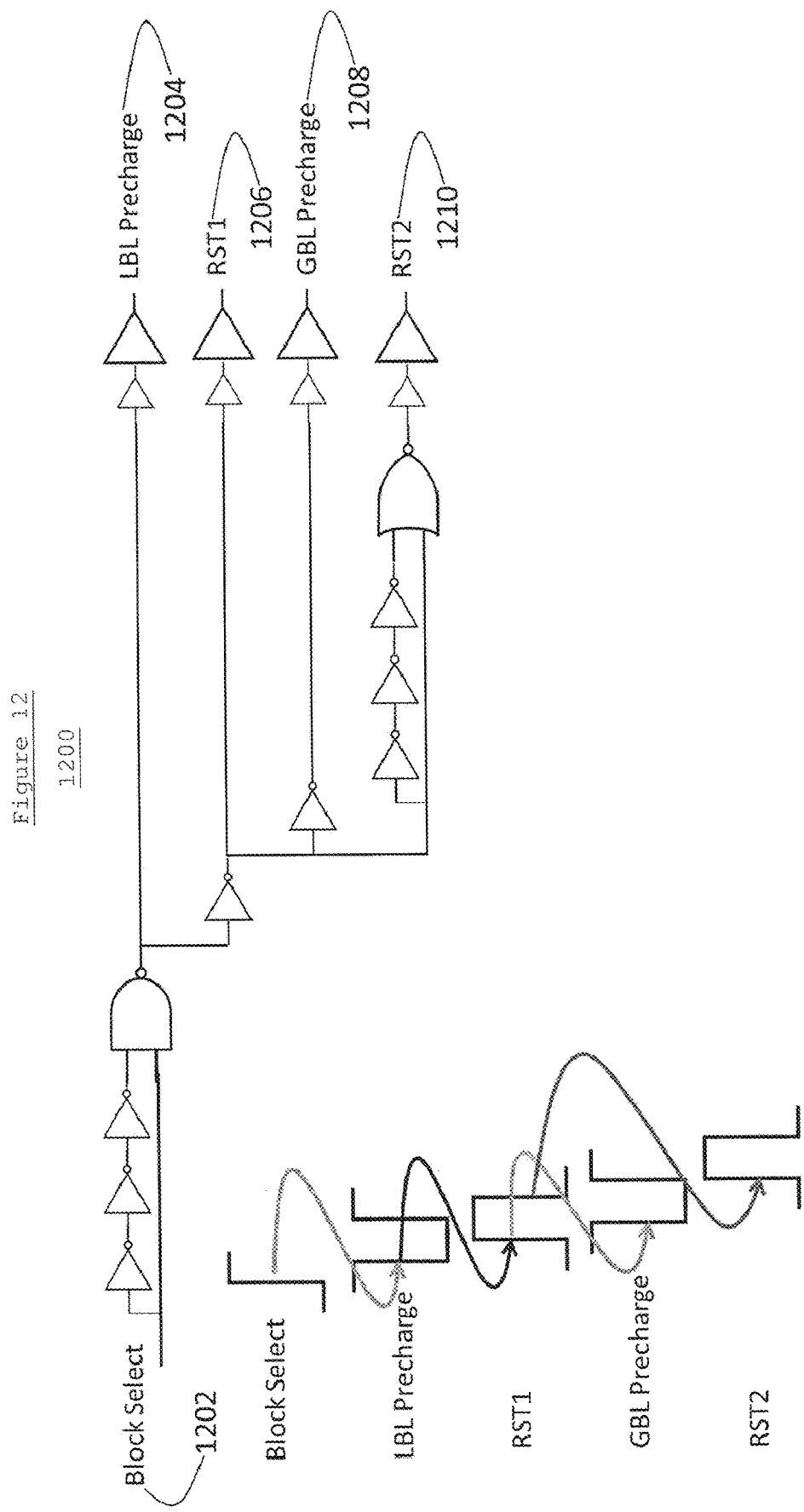

FIG. 12 1200 shows the simple pulse generator circuits developed to drive the set of 4 interlocked pulses required by the local and global bitpath right before each Read access to precharge the local and global bitlines, to reset the local, global harvesting nodes and to move harvested charge from the global bitline harvesting node V2G to the V2 grid described in FIG. 11.

Figure 13:
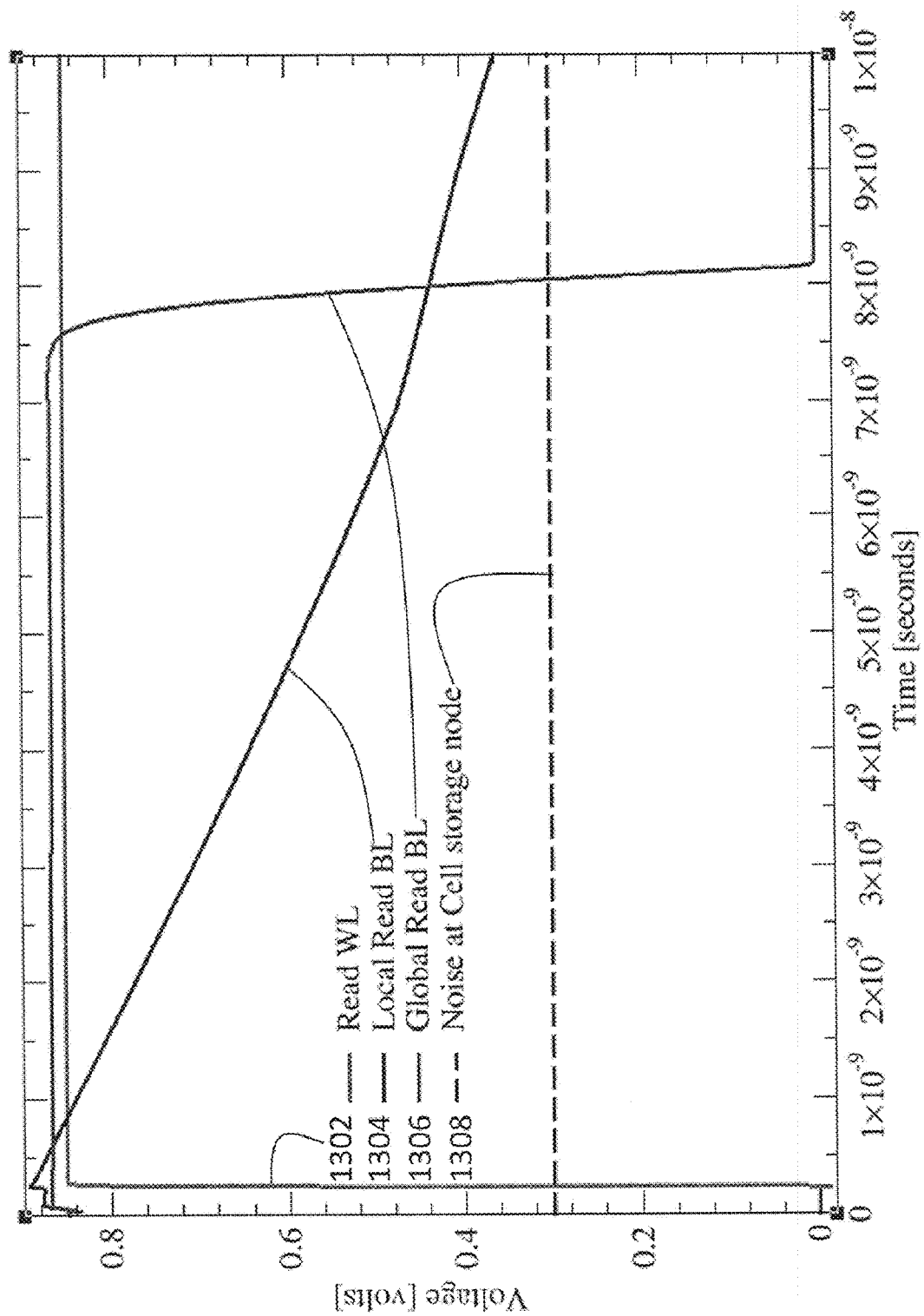

FIG. 13 1300 shows the read disturb failure where the local and global read bitlines accomplish a false evaluation due to presence of noise at the cell storage node 'BitB' 120, 220 in FIGS. 1 100, 2 200 during a simultaneous Read and Write access to the same row of 2P RF bitcells. This simulation assumes the keeper circuit scheme 316, 318 in FIG. 3 300 is not used.

Figure 14:
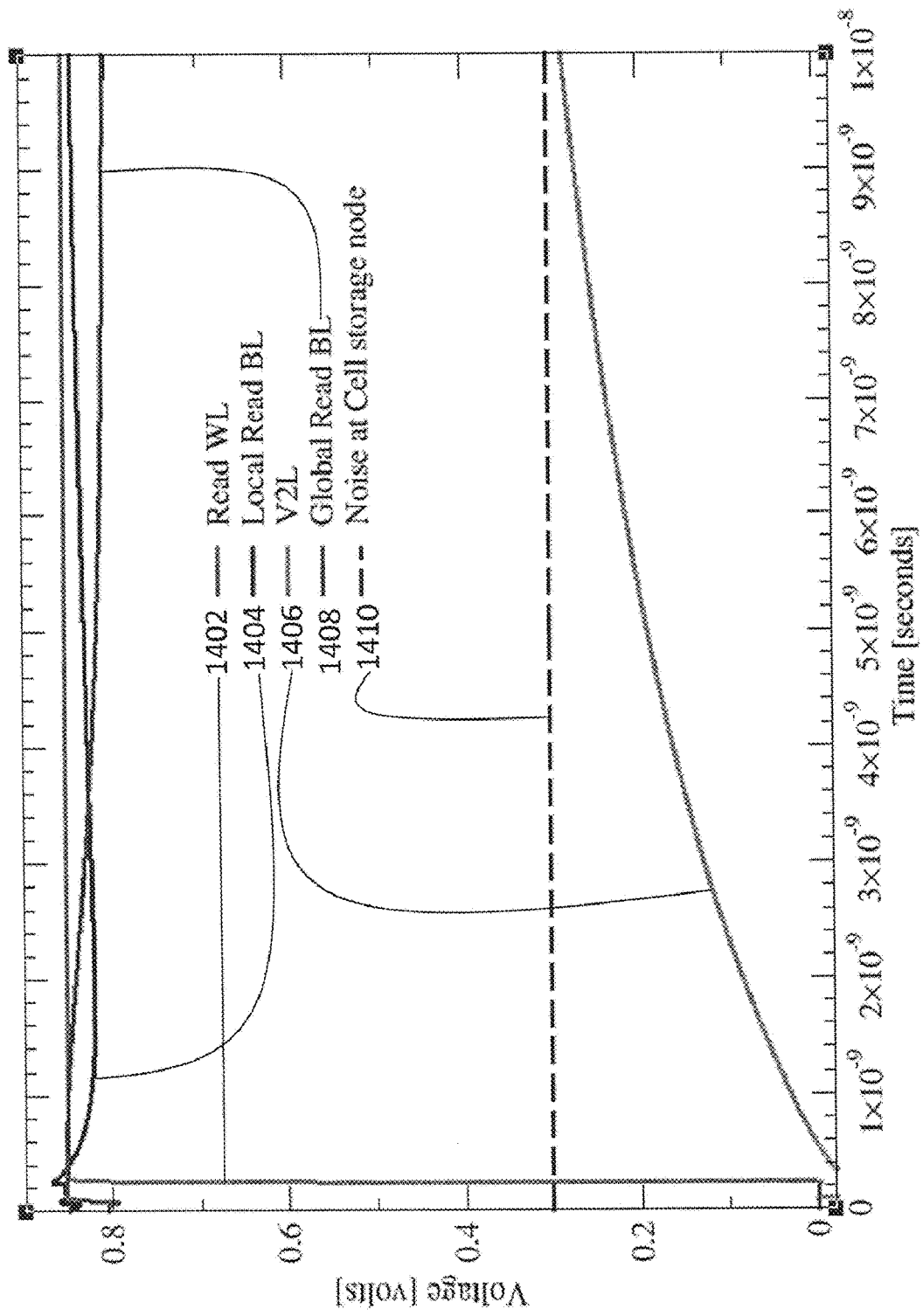

FIG. 14 1400 shows the avoidance of read disturb failure when using the bitpath shown in FIG. 7 700 without the use/need for Keeper circuits since the presence of noise at cell node 'BitB' 520, 620 in FIGS. 5 500, 6 600. Collection of harvested charge on the local harvesting node V2L self-disables the flow of spurious read current as the local harvesting node V2L approaches the noise voltage at 'BitB'.

Figure 15:
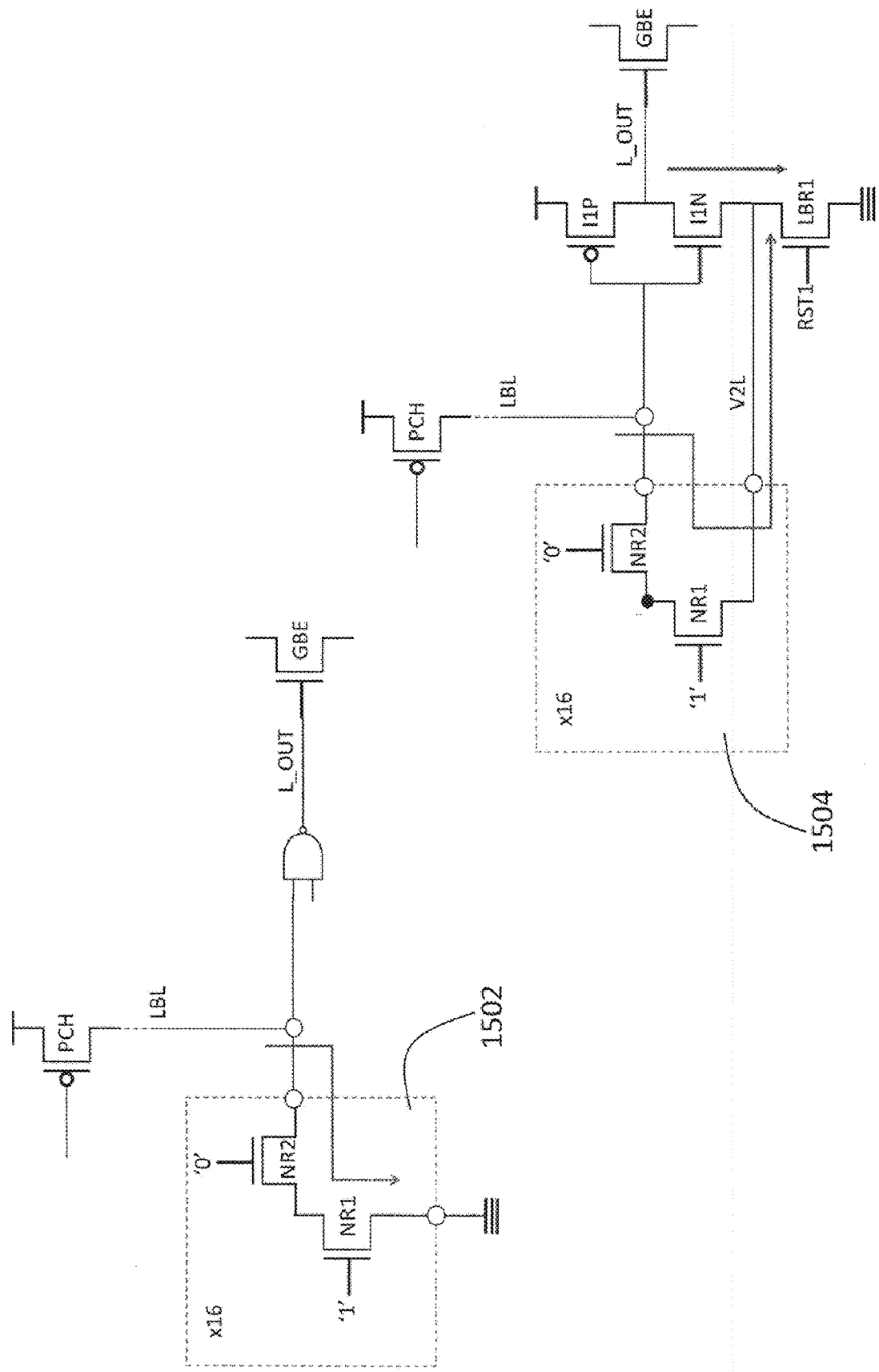

FIG. 15 1500 shows the dominant leakage path schematic for a conventional 2P RF column of bitcells and the leakage path schematic for the proposed 2P RF column of bitcells assuming the same number of bitcells per local bitline. In both cases, the read stack dominates the leakage from a bitcell since the read stack devices are typically higher performance than the other bitcell devices. The conventional bitpath has as many leakage paths as bitcells that share local bitline whereas the proposed bitpath has only one leakage path through the local bitline reset device LBR1 752 in FIG. 7 700.

Figure 16:
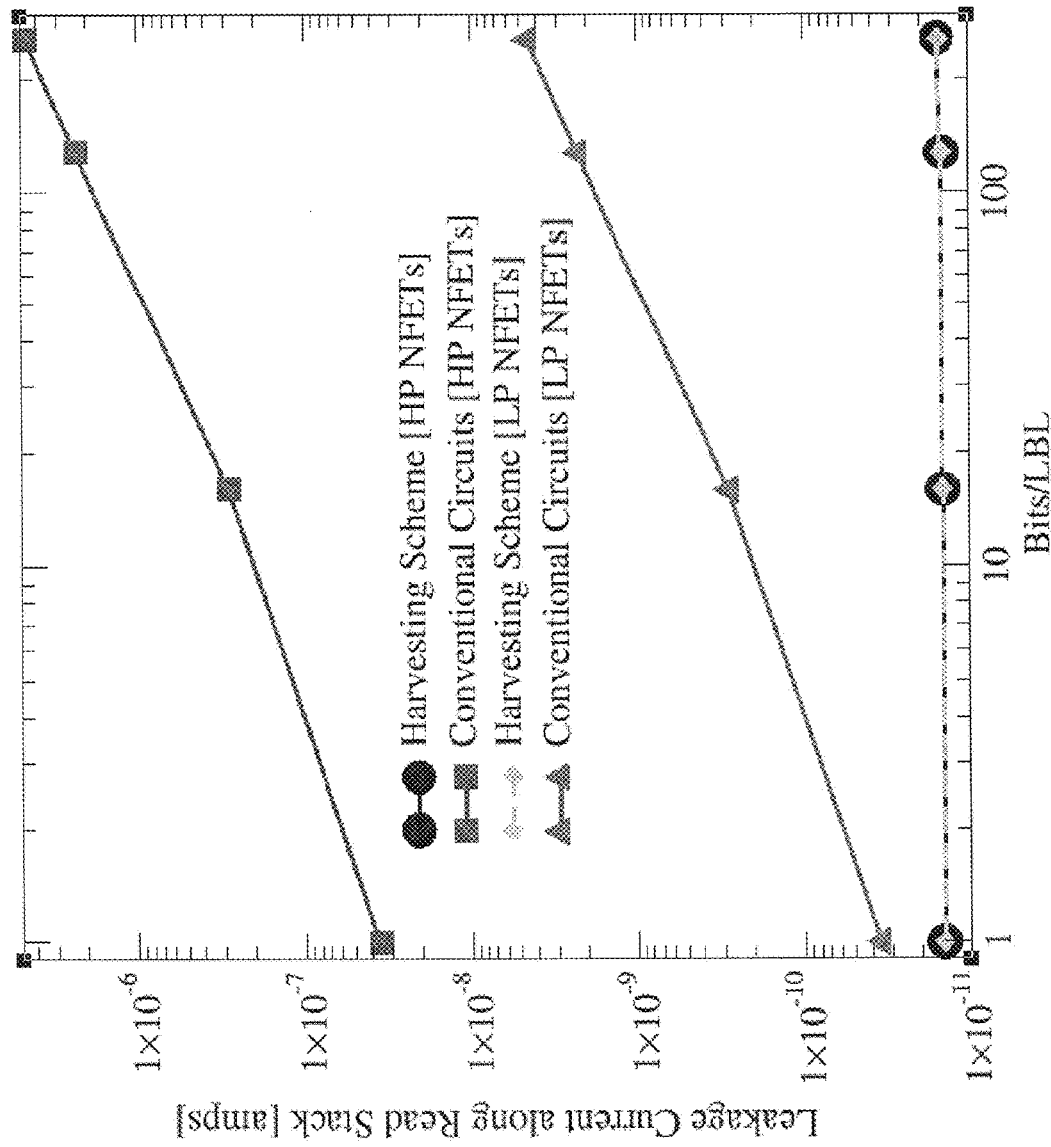

FIG. 16 1600 shows the leakage current from a bitcell column as a function of the number of bitcells per column. The proposed bitpath leakage remains unchanged since the number of leakage paths are fixed and they are independent of the the number of bitcells per local bitline.

4. DETAILED DESCRIPTION OF THE INVENTION

A. Operation of Proposed 2P RF Array Bitpath

1. Harvest of LBL & GRBL Evaluation Energy: In the 2P RF bitcell schematic in FIG. 5 500, the Source terminal of the NFET NR1 530 in the Read Stack 536 is connected to local bitline harvesting node 'V2L' 538—a metal line 738 shared by V2L terminals of bitcells that share the same local bitline 706 in the bitpath schematic shown in FIG. 7 700. The harvesting node V2L 738 has a comparable capacitance and resistance to the local bitline LBL 706 in FIG. 7 700 because the NFET stack typically has identical width devices NR1 530, 630 and NR2 532, 632 as seen in FIG. 6 600 with identical device capacitance contributions to either of the nets LBL 706 and V2L 738 in the bitpath schematic shown in FIG. 7 700. Since the wire lengths of nets LBL and V2L are also practically identical we can expect to see $C_{LBL}$ equal to $C_{V2L}$ The Read access proceeds in the proposed bitpath shown in FIG. 7 700 as with a conventional 2P RF bitpath, except that all of the charge flowing into the selected bitcell with 'BitB'=1, from the precharged local bitline LBL 706 in any given column—is harvested on V2L 738. This harvesting action raises the voltage on the local harvesting node V2L 738 at the same time and at the same rate of that voltage on the local bitline LBL 706 is lowered. This harvesting action practically doubles the signal development rate of the voltage asserted at the gate-source input of the sense-amp (inverter I1 732 in FIG. 7 700), until the read stack in the selected 2P RF bitcell self-disables because the voltage at V2L 738 has risen to within a VT of the local bitline LBL 706. (Note that the implementation could use a 2-way NAND gate with active high column select as the second input (or a 2-way NOR gate with active low column select) instead of inverter I1 732. The self-disabling action occurs when the read stack devices of the selected bitcells have insufficient gate overdrive to stay in the linear region and move into the subthreshold region as LBL 706 and V2L 738 converge in voltage (Shown by waveforms in FIG. 8 for proposed local bitpath). In this scheme, logic circuits used, deliver the benefit of scaling sensing speed with the CMOS platform without the burden of having to consume the energy of full swing operation—as conventional 2P RF arrays are required to.

The uncertainty in signal voltage developed by a conventional 2P RF bitpath due to the variability of read current through the read stack of the 2P RF bitcell would translate into higher energy consumption because the WL pulse width would have to be margined for the slowest bitcell which simply gives more time for all of the other bitcells in the array to discharge their precharged bitlines longer to lower voltages directly increasing the energy required to precharge them for a following read access. In the proposed bitpath, on the other hand, the voltage signal developed on the local bitline is the same and is determined by the capacitive divider between the local bitline LBL and the local harvesting node V2L which demonstrates much lower variability than small geometry bitcell transistors. The time taken for the slowest bitcell in the proposed datapath to resolve the data read from the bitcell is also half of the conventional bitpath due to the dual ended action at the input of the sensing circuit I1 732 in FIG. 7.

Similar harvesting action and dual ended sensing along the global bitpath in FIG. 7 enables the global bitpath to also harvest all of the precharge on the Global Read Bitline GRBL 710 onto the global bitline harvesting node V2G 740 in FIG. 7 700. Global sensing delay is also half of the corresponding delay in a conventional bitpath and without the uncertainty of signal development along the global read bitline GRBL 710, the energy consumed by the global bitpath is mostly harvested onto the V2 grid through NFET GBR1 742 directly before a Read access. Waveforms of the local and global bitpath in FIGS. 8 800 and 9 900. Control signals directly before a read access for the local and global bitpaths are generated as a set of 4 interlocked pulses that harvest, reset and precharge the bitpath as illustrated in FIG. 12

The capacitance of V2L is fixed and cannot be changed to charge V2L to a different voltage. So, the sensing inverter for the local BL, I1 triggers when LBL and V2L are within a VT of each other causing its output L_out to make a 0→1 transition as seen in FIG. 8 800 as well. The capacitance of V2G 740 can be designed to be 35% of the capacitance of the Global Read Bitline GRBL 710 using the placement scheme of the Global Bitline Evaluate (GBE) NFETs in the global bitpath as shown in a generic 8 block 2P RF array instance in FIG. 10 1000. By sizing the global harvesting line V2G 740 to 35% of the capacitance of the Global Read Bitline GRBL 710 the GBE devices self-disable when V2G has harvested merely 25% of the charge on the GRBL to be able to resolve the data sensed by the Global bitpath. This smaller voltage swing on the GRBL in tandem with dual ended sensing by I2 734 enables substantial (over 2×) improvements in the WL→G_out delay without changing operating voltages, the CMOS platform or the array architecture. Moreover, with substantially reduced voltage swings and no uncertainty in signal development in tandem with a complete harvest of evaluation charge in the local and global bitpaths enable over 3× reductions in active energy consumption when using the proposed bitpath.

2. Fast, energy and area efficient Sense amp action: As the LBL voltage drops during a read access due to BitB=1, the gate input voltage of I1 732 approaches I1's logic threshold, which itself moves to a higher voltage as voltage of V2L 738 rises with more harvested charge. As the LBL 706 voltage meets the rising logic threshold voltage of I1 732, the output of I1: L_out 712 rises fast due to the high gain of a CMOS inverter. Since L_out 712 directly drives the gate input of NFET GBE 730, GBE turns on and the precharged Global Read BL (GRBL) begins discharging as soon as L_out makes its 0→1 transition past the device threshold voltage of NFET GBE.

The global bitline harvesting node V2G 740 collects the precharge on GRBL 710 during a read access when resolving data corresponding to BitB=1 in the accessed bitcell. As with the LBL, the converging voltages on GRBL 710 and V2G 740 trigger a low→high transition at the output of inverter I2 734. A dropping GRBL voltage meets the rising logic threshold voltage of I2 734. The converging waveforms of GRBL 902 and V2G 904 (waveforms shown in FIG. 9 900) self-disable the NFET GBE 730 in the proposed bitpath.

An imbalanced capacitive divider is pursued in the Global BL to raise the voltage of V2G 740 higher than ¼ $V_{DD}$ so that V2G 740 can self-limit GRBL discharge sooner, at a voltage closer to $V_{DD}$ than to GND and can this consume much less charge from the $V_{DD}$ grid while resolving the same data as a conventional bitpath.

FIG. 11 shows the V2G line at about 35% of the length of GRBL-requiring the Global bitpath circuits: NFET GBE 730, inverter I2 734 and reset NFETs GBR1 742 and GBR2 744 to be placed b/w blocks 2 & 3 and b/w blocks 4 & 5. This placement allows V2G 740 to rise to over 70% of $V_{DD}$ limiting the charge harvested by V2G 740 from GRBL 710 on evaluate to less than 30% of what is typically dissipated from an equivalent industry-standard RF Global Read BL. Note that the sense amp action is much faster than the full-swing approach in conventional arrays because the signal development rate seen by I2 734 is double and the signal swing is a fourth of what would be seen on Global Read BL in a conventional RF array.

3. Reset of Dynamic nodes before Read Access: The Block Select signal from pre-decoders (FIG. 12 1200) triggers a set of 4 interlocked pulses to condition the local and global Read bitpath before the RWL select edge arrives. They condition the bitpath for fast evaluate and also condition the harvesting nodes V2L 738 and V2G 740 to 'reset' to GND before the selected bit cells begin evaluating. Charge harvested on V2G for each bit column from a previous Read is first moved to the grid V2 by GBR1 742 whose gate is driven by pulse RST1 752. Key requirement on RST1 is that it discharge V2L when RST1 drives gate input of NFET LBR1. Discharge of V2L has the effect of causing the output of I1 to discharge to GND which is where V2L is driven to by the pulse RST1 at gate input of LBR1. RST1 is asserted concurrently on the gate input of NFET GBR1 to move harvested charge on V2G to the harvesting grid V2.

Now that L_out 712 is discharged and GBE 730 is turned off, GRBL can be precharged to $V_{DD}$ from its partially discharged state from a previous Read access. Once RST1 has moved charge from V2G to V2, RST2 'resets' V2G to GND readying it for the impending Read. Also, since L_out 712 has been discharged during RST1, the NFET GBE is turned off enabling the precharged GRBL to hold its precharge voltage of $V_{DD}$ when V2G is discharged to GND by RST2.

All of the 4 signal outputs shown in FIG. 12 are generated off the Block select signal during a Read access in the sequence shown according to when each of the 4 signals are triggered off the Block select path. Systematic variations in Process/Voltage/Temp impact all of these gates in proximity to each other, but design considerations on the pulses from the point of generation to point of use within the block require sufficient width of the pulse. For e.g., the Fast-Slow corner for N and P channel FETs respectively at low T could cause the active high pulse (Resets 1, 2 to disappear. Similarly, Slow-Fast corner for N and P channel FETs respectively at low T impacts the active low pulse (local, global precharge). These and other risks would need to be simulated across all relevant corners to enable robust operation. Random variations in device characteristics are unlikely to be significant since these circuits will not be using small geometry devices.

4. Immunity to Disturb Current Failure: The proposed bitpath does not require keeper circuitry found in conventional RF array bit paths to avoid read failure when RWL and WWL concurrently select the same row of bit cells as seen in a conventional bitpath. This is illustrated in the circuit simulations of a conventional bitpath without keeper circuits: Cell noise at node 'BitB'-modeled with a voltage bump at the gate input of NR1, can initiate an unintended discharge of the LBL—as seen in FIG. 13 1300, when RWL selects the noisy bitcell. FIG. 13 shows a Read failure occurring when the WL pulse is long enough (and/or if the operating T or voltage or process corner or random VT fluctuations in the Read stack increase read current). The NAND output evaluates incorrectly to $V_{DD}$, causing the Global Read BL 310 in FIG. 3 300 in the conventional 2P RF bitpath to discharge when the LBL 306 voltage drops below the logic threshold of the NAND. The 'keeper' solution 316, 318 used by conventional RF arrays that avoids the above disturb current failure, however, increases the WL select→G_out delays by over 20% [23].

When using the proposed bitpath circuits, keepers are not required since the rising voltage on V2L 738 due to noise voltage at the gate of NFET NR1, self-disables the discharge of the LBL 706 as V2L asymptotically approaches the noise voltage (FIG. 14). The LBL 706 and GRBL 710 can thus be seen in FIG. 14 as maintaining their precharge state of $V_{DD}$ or close enough to $V_{DD}$ without evaluating incorrectly as the conventional 2P RF array would in the scenario described above 5. Leakage reduction: FIG. 15 1500 shows the dominant leakage path schematic for a conventional 2P RF column of bitcells and the leakage path schematic for the proposed 2P RF column of bitcells assuming the same number of bitcells per local bitline. In both cases, the read stack dominates the leakage from a bitcell since the read stack devices are typically higher performance than the other bitcell devices. The conventional bitpath has as many leakage paths (1502 in FIG. 15 1500) as bitcells that share the local bitline whereas the proposed bitpath has only one leakage path 1504 in FIG. 15 1500 through the local bitline reset device LBR1 752 in FIG. 7 700. FIG. 16 1600 shows the leakage current from a bitcell column as a function of the number of bitcells per column. The proposed bitpath leakage remains unchanged since the number of leakage paths are fixed and they are independent of the number of bitcells per local bitline.

REFERENCES

[1] R. H. Dennard et al, "Design of Ion-implanted MOSFET's with Very Small Physical Dimensions", IEEE Journal of Solid-State Circuits, Vol 9, No. 5 Oct. 1974

[2] R. W. Keyes, "The effect of randomness in the distribution of impurity atoms on FET threshold," App. Phys., vol. 8, pp. 251-259, 1975

[3] J Meindl et al, "The impact of stochastic dopant and interconnect distributions on gigascale integration", 1997 ISSCC Dig. of Tech. Papers, Pg. 282, February 1997.

[4] A Bhavnagarwala et al., "The impact of intrinsic device fluctuations on CMOS SRAM cell stability", IEEE Journal of Solid-State Ckts, Vol 36, No. 4, Pg. 658, April 2001

[5] J. Burr et al., "A 200 mV encoder-decoder circuit using Stanford Ultra Low Power CMOS," in ISSCC Dig. Tech. Papers, February 1994, pp. 84-85.

[6] A. Bhavnagarwala et al., "A minimum total power methodology for projecting limits on CMOS GSI", IEEE Trans. on VLSI Systems, Vol 8, No. 3, Pg. 235, June 2000

[7] B. Meyerson, "Collaborative Innovation: A new lever in Information Technology Development" https://ieeexplore.ieee.org/document/7477866

[8] https://www.eetimes.com/intel-technologist-cites-power-as-biggest-issue/#

[9] J Hennessy & D Patterson, "A New Golden Age for Computer Architecture", Communications of the ACM, Vol 62, No. 2 pgs. 48-60, February 2019

[10] M Horowitz, "Computing's Energy Problem (and what we can do about it)" Plenary Presentation, ISSCC Dig. of Tech Papers, pg 10-14, February 2014

[11] M Gebhart et al, "Energy-efficient Mechanisms for Managing Thread Context in Throughput Processors" ISCA 2011, pg. 236-246, June 2011

[12] M Gebhart et al, "A Hierarchical Thread Scheduler and Register File for Energy-efficient Throughput Processors", ACM Transactions on Computer Systems, Vol 20, No. 2, April 2012

[13] V Sze et al, "Efficient Processing of Deep Neural Networks: A Tutorial and Survey" Proceedings of the IEEE, Vol 105, No. 12, December 2017

[14] M Gebhart et al., "Unifying Primary Cache, Scratch, and Register File Memories in a Throughput Processor", 45th Annual IEEE/ACM International Symposium on Microarchitecture, Pg. 96, June 2012

[15] https://www.geeks3d.com/20200514/nvidia-ampere-ga100-gpu-8192-cuda-cores-and-54-bllion-transistors/#:~:text=Core %20 GPU%20 specifications %3A-, GA100%20 GPU%20built%20 on%20a%207nm%20 manufacturing%20 process, 64%20 CUDA%20cores%20 per%20SM)

[16] M Gao et al, "TETRIS: Scalable and Efficient Neural Network Acceleration with 3D Memory", ASPLOS 2017, pg 751, April 2017

[17] J. Kulkarni et al., "Low Swing and Column Multiplexed Bitline Techniques for Low-Vmin, Noise-Tolerant, High-Density, 1R1 W 8T-Bitcell SRAM in 10 nm FinFET CMOS", 2020 Symposium on VLSI Circuits, Paper CM1.3, June 2020

[18] J Keane et al, "5.6 Mb/mm2 1R1 W 8T SRAM Arrays Operating down to 560 mV Utilizing Small-Signal Sensing with Charge-Shared Bitline and Asymmetric Sense Amplifier in 14 nm FinFET CMOS Technology" ISSCC Tech. Dig. of Papers, 2016 ISSCC Paper 17.2, pg 308, February 2016

[19] G Arindrajit et al, "Compiler compatible 5.66 Mb/mm2 8T 1R1 W register file in 14 nm FinFET technology", Integration, the VLSI Journal, 70 (2020) pg 126-137.

[20] A Fritsch et al, "A 6.2 GHz single ended current based sense amplifier (CSA) compliable 8T SRAM in 7 nm FinFET technology" Presentation 24.1, 2021 ISSCC Dig. of Tech Papers, February 2021

[21] K Zhang et al, "The Scaling of Data Sensing Schemes for High-Speed Cache Design in Sub-0.18 um Technologies", Symposium on VLSI Circuits 2000, pg. 226, June 2000

[22] M. Pelgrom et al, "Matching properties of MOS transistors", JSCC, vol. 24, no. 5, pp. 1433-1439, October 1989

[23] H. Fujiwara et al., "A 64kb 16 nm Asynchronous Disturb Current Free 2-Port SRAM with PMOS Pass-Gates for FinFET Technologies", ISSCC 2015 Dig. of Tech Papers, pg. 312-313, February 2015.

[24] Makoto Yabuuchi et al., "A 28 nm High Density 1R/1 W 8T-SRAM Macro with Screening Circuitry Against Read Disturb Failure," IEEE Custom Integrated Circuits Conference, pp. 1-4, September 2013.

[25] N. Nintunze et al., "A Register File with 8.4 GHz Throughput for Efficient Instruction Scheduling in a Pentium-4 Processor", 2006 Symposium on VLSI Circuits, pp. 188-189, June 2006

[26] J. Kulkarni et al., "Low Swing and Column Multiplexed Bitline Techniques for Low-Vmin, Noise-Tolerant, High-Density, 1R1 W 8T-Bitcell SRAM in 10 nm FinFET CMOS", 2020 Symposium on VLSI Circuits, Paper CM1.3, June 2020

[27] M Yi et al, "Co-Mitigating Circuit PBTI and HCl Aging Considering NMOS Transistor Stacking Effect", 2016 International Symposium on Integrated Circuits (ISIC), 2016, pp. 1-5

[28] C-H Ho et al, "Analysis of Stability Degradation of SRAMs Using a Physics-Based PBTI Model", IEEE Electron Device Letters, vol. 35, no. 9, pp. 951-953, September 2014

What is claimed is:

1. An apparatus comprising:
inverter circuitry including a first reference ground terminal; and
NAND circuitry that is (1) electrically coupled to the inverter circuitry via a connection that is an output of the NAND circuitry and an input to the inverter circuitry and (2) includes a second reference ground terminal, the first reference ground terminal and the second reference ground terminal electrically coupled as a local harvest node, charge flowing at the local harvest node discharged to ground during operation and prior to the connection receiving a voltage.

2. The apparatus of claim 1, wherein charge flowing at the local harvest node is further discharged to a global harvest node included in the inverter circuitry during operation and prior to the connection receiving the voltage.

3. The apparatus of claim 1, wherein the NAND circuitry includes a first negative field effect transistor (NFET) and a second NFET in series with the first NFET, a drain terminal of the first NFET electrically is coupled to the connection, a source terminal of the second NFET is electrically coupled to the local harvest node, a source terminal of the first NFET is electrically coupled to a drain terminal of the second NFET.

4. The apparatus of claim 1, wherein:
the NAND circuitry includes a first NFET and a second NFET in series with the first NFET,
a drain terminal of the first NFET is electrically coupled to the connection,
a source terminal of the second NFET is electrically coupled to the local harvest node,
a source terminal of the first NFET is electrically coupled to a drain terminal of the second NFET
the connection is charged via a supply voltage, and
the first NFET and the second NFET configured to discharge to the connection in response to the output of the NAND circuitry being charged via the supply voltage.

5. The apparatus of claim 1, wherein the inverter circuitry includes an NFET and a positive field effect transistor (PFET), a source terminal of the PFET is electrically coupled to a power supply, a drain terminal of the PFET and a drain terminal of the NFET is electrically coupled to an output of the inverter circuitry, a source terminal of the NFET is electrically coupled to the local harvest node.

6. The apparatus of claim 1, wherein the NAND circuitry includes a first NFET and a second NFET in parallel to the first NFET, a source terminal of the first NFET is electrically coupled to the local harvest node, a source terminal of the second NFET is electrically coupled to the local harvest node.

7. The apparatus of claim 1, wherein the NAND circuitry includes a buffer that includes an NFET, a source terminal of the NFET is electrically coupled to the local harvest node.

8. The apparatus of claim 1, wherein a capacitance associated with the local harvest node is equal to a capacitance associated with the connection.

9. The apparatus of claim 1, wherein a resistance associated with the local harvest node is equal to a resistance associated with the connection.

10. The apparatus of claim 1, wherein the local harvest node is associated with a first wire and the connection is associated with a second wire, a length of the first wire equal to a length of the second wire.

11. The apparatus of claim 1, wherein an output of the inverter circuitry is connected to a latch.

12. The apparatus of claim 1, further comprising a plurality of bitcells, each bitcell from the plurality of bitcells electrically coupled to an input of the NAND circuitry, the local harvest node, and the connection.

13. An apparatus, comprising:
    NAND circuitry including a first NFET and a second NFET; and
    inverter circuitry including a plurality of inverters and electrically connected to the NAND circuitry using a first connection and a second connection, charge flowing on the first connection harvested on the second connection during operation, a drain terminal of the first NFET electrically coupled to the first connection, a source terminal of the second NFET electrically coupled to the second connection.

14. The apparatus of claim 13, wherein charge flowing on the second connection is discharged to a global harvest node included in the inverter circuitry during operation and prior to the first connection receiving a voltage.

15. The apparatus of claim 13, wherein:
    the first connection is charged via a supply voltage, and
    the first NFET and the second NFET are configured to discharge to the second connection in response to the first connection being charged via the supply voltage.

16. The apparatus of claim 13, wherein the inverter circuitry includes a third NFET and a PFET, a source terminal of the PFET is electrically coupled to a power supply, a drain terminal of the PFET and a drain terminal of the third NFET is electrically coupled to an output of the inverter circuitry, a source terminal of the third NFET is electrically coupled to the second connection.

17. An apparatus, comprising:
    inverter circuitry including a first reference ground terminal; and
    NAND circuitry that is (1) electrically coupled to the inverter circuitry via a connection that is an output of the NAND circuitry and an input to the inverter circuitry and (2) includes a second reference ground terminal, the first reference ground terminal and the second reference ground terminal electrically coupled as a local harvest node, charge flowing on the connection harvested on the local harvest node during operation.

18. The apparatus of claim 17, wherein the NAND circuitry includes a first NFET and a second NFET in series with the first NFET, a drain terminal of the first NFET is electrically coupled to the connection, a source terminal of the second NFET is electrically coupled to the local harvest node, a source terminal of the first NFET is electrically coupled to a drain terminal of the second NFET.

19. The apparatus of claim 17, wherein:
    the NAND circuitry includes a first NFET and a second NFET in series with the first NFET,
    a drain terminal of the first NFET is electrically coupled to the connection,
    a source terminal of the second NFET is electrically coupled to the local harvest node,
    a source terminal of the first NFET is electrically coupled to a drain terminal of the second NFET
    the output of the NAND circuitry is charged via a supply voltage, and
    the first NFET and the second NFET are configured discharge to the output of the NAND circuitry in response to the output of the NAND circuitry being charged via the supply voltage.

20. The apparatus of claim 17, wherein the NAND circuitry includes a first NFET and a second NFET parallel to the first NFET, a source terminal of the first NFET is electrically coupled to the local harvest node, a source terminal of the second NFET is electrically coupled to the local harvest node.

* * * * *

UNITED STATES PATENT AND TRADEMARK OFFICE
CERTIFICATE OF CORRECTION

PATENT NO. : 12,046,278 B2
APPLICATION NO. : 17/578482
DATED : July 23, 2024
INVENTOR(S) : Azeez Bhavnagarwala Page 1 of 4

It is certified that error appears in the above-identified patent and that said Letters Patent is hereby corrected as shown below:

In the Claims

At Column 12, Claim number 1, Line number 28:
"NAND circuitry that is (1) electrically coupled to the"
Should read:
--circuitry that is (1) electrically coupled to the--

At Column 12, Claim number 1, Line number 30:
"the NAND circuitry and an input to the inverter cir-"
Should read:
--the circuitry and an input to the inverter cir- --

At Column 12, Claim number 1, Line number 36:
"prior to the connection receiving a voltage."
Should read:
--prior to the connection receiving a voltage, the circuitry being one of NAND circuitry or NOR circuitry.--

At Column 12, Claim number 2, Line number 38:
"local harvest node is further discharged to a global harvest"
Should read:
--local harvest node is at least partially discharged to a global harvest--

At Column 12, Claim number 2, Line numbers 39-40:
"node included in the inverter circuitry during operation and
prior to the connection receiving the voltage."
Should read:
--node included in the inverter circuitry
prior to the charge flowing at that local harvest node being discharged to ground.--

Signed and Sealed this
Twenty-first Day of January, 2025

Coke Morgan Stewart
*Acting Director of the United States Patent and Trademark Office*

CERTIFICATE OF CORRECTION (continued)
U.S. Pat. No. 12,046,278 B2

At Column 12, Claim number 3, Line number 41:
"3, The apparatus of claim 1, wherein the NAND circuitry"
Should read:
--3. The apparatus of claim 1, wherein the circuitry--

At Column 12, Claim number 4, Line number 50:
"the NAND circuitry includes a first NFET and a second"
Should read:
--the circuitry includes a first NFET and a second--

At Column 12, Claim number 4, Line number 61:
"the NAND circuitry being charged via the supply"
Should read:
--the circuitry being charged via the supply--

At Column 13, Claim number 6, Line number 3:
"6. The apparatus of claim 1, wherein the NAND circuitry"
Should read:
--6. The apparatus of claim 1, wherein the circuitry--

At Column 13, Claim number 7, Line number 9:
"7. The apparatus of claim 1, wherein the NAND circuitry"
Should read:
--7. The apparatus of claim 1, wherein the circuitry--

At Column 13, Claim number 8, Line number 13:
"associated with the local harvest node is equal to a capaci-"
Should read:
--associated with the local harvest node is substantially equal to a capaci- --

At Column 13, Claim number 9, Line number 16:
"ated with the local harvest node is equal to a resistance"
Should read:
--ated with the local harvest node is substantially equal to a resistance--

At Column 13, Claim number 12, Line number 27:
"electrically coupled to an input of the NAND circuitry, the"
Should read:
--electrically coupled to an input of the circuitry, the--

At Column 13, Claim number 13, Line numbers 30-31:
"NAND circuitry including a first NFET and a second NFET; and"
Should read:
--circuitry including a first NFET and a second NFET, the circuitry being one of NAND circuitry or NOR circuitry; and--

CERTIFICATE OF CORRECTION (continued)
U.S. Pat. No. 12,046,278 B2

At Column 13, Claim number 13, Line number 33:
"electrically connected to the NAND circuitry using a"
Should read:
--electrically connected to the circuitry using a--

At Column 14, Claim number 17, Line number 11:
"NAND circuitry that is (1) electrically coupled to the"
Should read:
--circuitry that is (1) electrically coupled to the--

At Column 14, Claim number 17, Line number 13:
"the NAND circuitry and an input to the inverter cir-"
Should read:
--the circuitry and an input to the inverter cir- --

At Column 14, Claim number 17, Line number 18:
"tion."
Should read:
--tion, the circuitry being one of NAND circuitry of NOR circuitry.--

At Column 14, Claim number 18, Line number 19:
"18. The apparatus of claim 17, wherein the NAND"
Should read:
--18. The apparatus of claim 17, wherein the--

At Column 14, Claim number 19, Line number 27:
"the NAND circuitry includes a first NFET and a second"
Should read:
--the circuitry includes a first NFET and a second--

At Column 14, Claim number 19, Line number 35:
"the output of the NAND circuitry is charged via a supply"
Should read:
--the output of the circuitry is charged via a supply--

At Column 14, Claim number 19, Line number 38:
"discharge to the output of the NAND circuitry in"
Should read:
--to discharge the output of the circuitry in--

At Column 14, Claim number 19, Line number 39:
"response to the output of the NAND circuitry being"
Should read:
--response to the output of the circuitry being--

At Column 14, Claim number 20, Line number 41:
"20. The apparatus of claim 17, wherein the NAND"
Should read:
--20. The apparatus of claim 17, wherein the--